(12) United States Patent
Ohmi

(10) Patent No.: US 8,193,642 B2
(45) Date of Patent: Jun. 5, 2012

(54) INTERLAYER INSULATING FILM, INTERCONNECTION STRUCTURE, AND METHODS OF MANUFACTURING THE SAME

(75) Inventor: Tadahiro Ohmi, Miyagi (JP)

(73) Assignees: Tohoku University, Sendai-Shi (JP); Foundation for Advancement of International Science, Tsukuba-Shi (JP)

( * ) Notice: Subject to any disclaimer, the term of this patent is extended or adjusted under 35 U.S.C. 154(b) by 1007 days.

(21) Appl. No.: 11/922,476

(22) PCT Filed: Jun. 20, 2006

(86) PCT No.: PCT/JP2006/312292
§ 371 (c)(1),
(2), (4) Date: Dec. 19, 2007

(87) PCT Pub. No.: WO2006/137384
PCT Pub. Date: Dec. 28, 2006

(65) Prior Publication Data
US 2009/0108413 A1    Apr. 30, 2009

(30) Foreign Application Priority Data
Jun. 20, 2005   (JP) .................... 2005-179591

(51) Int. Cl.
*H01L 23/48*   (2006.01)
*H01L 23/52*   (2006.01)
*H01L 29/40*   (2006.01)
*H01L 21/4763*   (2006.01)

(52) U.S. Cl. . 257/759; 257/760; 257/774; 257/E23.011; 257/E21.579; 438/623; 438/624; 438/638

(58) Field of Classification Search .................. None
See application file for complete search history.

(56) References Cited

U.S. PATENT DOCUMENTS

| | | | |
|---|---|---|---|
| 5,470,661 A | 11/1995 | Bailey et al. | |
| 5,559,367 A | 9/1996 | Cohen et al. | |
| 6,218,299 B1 * | 4/2001 | Akahori et al. | 438/682 |
| 6,265,779 B1 | 7/2001 | Grill et al. | |
| 6,323,555 B1 | 11/2001 | Maex et al. | |
| 6,407,011 B1 | 6/2002 | Ikeda et al. | |

(Continued)

FOREIGN PATENT DOCUMENTS

EP      1 146 555 A1    10/2001

(Continued)

OTHER PUBLICATIONS

US Office Action for U.S. Appl. No. 12/987,914, issued on Feb. 9, 2012; 14 pages.

*Primary Examiner* — Hoang-Quan Ho
(74) *Attorney, Agent, or Firm* — Foley & Lardner LLP

(57) ABSTRACT

This invention provides an interlayer insulating film for a semiconductor device, which has low permittivity, is free from the evolution of gas such as CFx and $SiF_4$ and is stable, and a wiring structure comprising the same. In an interlayer insulating film comprising an insulating film provided on a substrate layer, the interlayer insulating film has an effective permittivity of not more than 3. The wiring structure comprises an interlayer insulating film, a contact hole provided in the interlayer insulating film, and a metal filled into the contact hole. The insulating film comprises a first fluorocarbon film provided on the substrate layer and a second fluorocarbon film provided on the first fluorocarbon film.

36 Claims, 39 Drawing Sheets

U.S. PATENT DOCUMENTS

| | | |
|---|---|---|
| 6,419,985 B1 | 7/2002 | Ishizuka |
| 6,437,441 B1 | 8/2002 | Yamamoto |
| 6,528,865 B1 * | 3/2003 | Banerjee ................ 257/642 |
| 6,838,370 B1 * | 1/2005 | Niuya et al. ............. 438/623 |
| 6,975,018 B2 | 12/2005 | Ohmi et al. |
| 7,002,252 B2 | 2/2006 | Yamamoto |
| 7,803,705 B2 * | 9/2010 | Kobayashi et al. ........ 438/623 |
| 2002/0164883 A1 * | 11/2002 | Ohmi et al. ............. 438/726 |
| 2002/0168483 A1 * | 11/2002 | Nakase et al. ............ 427/569 |
| 2002/0173116 A1 | 11/2002 | Apyama et al. |
| 2005/0221611 A1 | 10/2005 | Yamamoto |
| 2005/0272266 A1 | 12/2005 | Ohmi et al. |

FOREIGN PATENT DOCUMENTS

| | | |
|---|---|---|
| EP | 1146555 A1 * | 10/2001 |
| JP | 11-087510 | 3/1999 |
| JP | 11-162962 | 6/1999 |
| JP | 2001-044191 A | 2/2001 |
| JP | 2002-016050 A | 1/2002 |
| JP | 2002-220668 A | 8/2002 |
| JP | 2002-261091 A | 9/2002 |
| WO | WO-2005/050726 A1 | 6/2005 |
| WO | WO2005050726 * | 6/2005 |

* cited by examiner

INTERLAYER INSULATING FILM, INTERCONNECTION STRUCTURE, AND METHODS OF MANUFACTURING THE SAME

TECHNICAL FIELD

This invention relates to a multilayer interconnection structure, particularly an interlayer insulating film structure, of a board, such as a semiconductor-element or semiconductor-chip mounting board or a wiring board and further relates to a semiconductor device having the multilayer interconnection structure, a wiring board having the multilayer interconnection structure, and an electronic device including them. Moreover, this invention relates to a method of manufacturing the multilayer interconnection structure and methods of manufacturing the semiconductor device having the multilayer interconnection structure, the wiring board having the multilayer interconnection structure, and the electronic device including them.

BACKGROUND ART

Conventionally, an interlayer insulating film is formed for insulation between interconnection layers in a multilayer interconnection structure on a semiconductor substrate or the like.

In such a multilayer interconnection structure, a problem of signal delay due to the parasitic capacitance between interconnections and the interconnection resistance has become unignorable and it has been required to use an interlayer insulating film having a low permittivity (Low-k).

As such an interlayer insulating film, attention has been paid to the fact that a fluorocarbon film (hereinafter referred to as a CFx film) has a very low permittivity and thus can reduce the parasitic capacitance between interconnections. However, the CFx film is very weak against water and poor in adhesion. Therefore, the CF film is formed on an underlayer such as an SiCN layer, an $Si_3N_4$ layer, or an $SiO_2$ layer, but there has been a problem in the bottom and top surfaces of the CF film (i.e. the beginning and end of the film formation).

Conventionally, a CFx film is formed by the use of a plasma processing apparatus using a fluorocarbon gas (referred to as a CFx gas, e.g. a $C_5F_8$ gas), for example, as described in Patent Document 1.

As described in Patent Document 2, this CFx gas is originally used for etching and thus there has been a problem that if the plasma treatment temperature is high, an underlayer is etched to produce a silicon fluoride ($SiF_4$) gas.

Further, there has been a problem that water and gases such as CFx and $SiF_4$ are released from the surface of the formed CF film to form a contamination source.

Patent Document 3 describes that a formed CFx film is annealed in an $N_2$ atmosphere at 400° C. to 450° C., so that outgassing after the film formation is small in amount.

Further, plasma treatment is performed using a single rare gas when forming an oxide film, a nitride film, an oxynitride film, or the like as an underlying metal on a silicon semiconductor. In the case of using a single rare gas, use is made of a krypton (Kr) gas or a xenon (Xe) gas having a large sectional area for collision with electrons and a low plasma electron temperature for the purpose of reducing plasma damage to post-treatment (e.g. see Patent Document 4).

Patent Document 1: Japanese Unexamined Patent Application Publication (JP-A) No. 2002-220668
Patent Document 2: Japanese Unexamined Patent Application Publication (JP-A) No. 2002-16050
Patent Document 3: Japanese Unexamined Patent Application Publication (JP-A) No. H11-162962
Patent Document 4: Japanese Unexamined Patent Application Publication (JP-A) No. 2002-261091

DISCLOSURE OF THE INVENTION

Problem to be Solved by the Invention

It is therefore an object of this invention to provide an interlayer insulating film of a semiconductor device or the like, which has a low permittivity, is free from generation of gases such as CFx and $SiF_4$, and is stable.

It is another object of this invention to provide a method of manufacturing an interlayer insulating film of a semiconductor device or the like, which has a low permittivity, is free from generation of gases such as CFx and $SiF_4$, and is stable.

It is still another object of this invention to provide an interconnection structure of a semiconductor device or the like, comprising an interlayer insulating film having a low permittivity and being free from generation of gases such as CFx and $SiF_4$ and stable.

It is a further object of this invention to provide a method of manufacturing an interconnection structure of a semiconductor device or the like, comprising an interlayer insulating film having a low permittivity and being free from generation of gases such as CFx and $SiF_4$ and stable.

It is still another object of this invention to provide methods of manufacturing the above interlayer insulating film and the above interconnection structure.

Means for Solving the Problem

According to one aspect of the present invention, there is provided an interlayer insulating film which includes an insulating film formed on an underlayer, said interlayer insulating film having an effective permittivity of 3 or less.

In the aspect of the present invention, it is preferable that the insulating film includes a first fluorocarbon film formed on the underlayer and a second fluorocarbon film formed on the first fluorocarbon film and having a permittivity lower than that of the first fluorocarbon film.

In the interlayer insulating film, it is also preferable that the first fluorocarbon film has a thickness of 5 to 10 nm and the second fluorocarbon film has a thickness of 280 to 500 nm. Furthermore, it is preferable that each of the first and the second fluorocarbon films has a low permittivity. Specially, it is preferable that the permittivity of the second fluorocarbon film is 1.5 to 2.5. Moreover, it is preferable that the underlayer includes at least one of an SiCN layer, a silicon nitride ($Si_3N_4$) layer, an SiCO layer, and an $SiO_2$ layer formed on a base body. Specially, it is preferable that the first fluorocarbon film is provided for preventing generation of a fluorosilane gas produced by a reaction with the underlayer.

In addition, the first fluorocarbon film may be formed by CVD using a plasma generated by using a Xe or Kr gas. On the other hand, the second fluorocarbon film may be formed by CVD using a plasma generated by using an Ar gas.

It is also preferable that a surface of the second fluorocarbon film is nitrided and a thickness of a nitrided portion of the surface is 1 to 5 nm, preferably 2 to 3 nm.

It is preferable that a film formed on the insulating film and made of at least one of $Si_3N_4$, SiCN, SiCO is provided.

According to another aspect of the present invention, there is provided a method of forming a fluorocarbon film on an underlayer using a fluorocarbon gas and two or more kinds of rare gas. The method includes a first step of forming a first fluorocarbon film on the underlayer by a plasma generated by using a rare gas other than an Ar gas and a second step of forming a second fluorocarbon film on the first fluorocarbon film by a plasma generated by using an Ar gas.

In the method according to the aspect of the present invention, it is preferable that the first fluorocarbon film is formed up to a thickness of 5 to 10 nm and the second fluorocarbon film is formed up to a thickness of 280 to 500 nm on the first fluorocarbon film. Specially, it is preferable that the second fluorocarbon film has a permittivity lower than that of the first fluorocarbon film.

In addition, It is preferable that the underlayer is a layer including at least one of an SiCN layer, an $Si_3N_4$ layer, an $SiO_2$ layer, and an SiCO layer formed on a base body and that the rare gas used in the first step is a Xe gas.

Furthermore, the film of at least one kind of $Si_3N_4$, SiCN, and SiCO may be formed by adding at least one of a nitrogen gas and an oxidizing gas to the rare gas and flowing a $SiH_4$ gas as a reactive gas.

According to still another aspect of the present invention, there is provided a method of manufacturing a multilayer interconnection structure of a semiconductor device or the like. The method includes a step of forming a fluorocarbon film as at least portion of an interlayer insulating film, a step of annealing the fluorocarbon film, and a step of nitriding a surface of the fluorocarbon film.

In the present invention, it is preferable that the annealing step is performed in an inert gas without exposure to the atmosphere. It is also preferable that the nitriding step is performed in a plasma using an Ar gas and using an $N_2$ gas or in a plasma using an $N_2$ gas. In the latter case, it is preferable that the nitriding step is performed at a temperature of 200° C. or higher, more preferably at a temperature of 300° C. to 400° C.

Furthermore, it is preferable that the method further includes, before or after the annealing step, a step of irradiating the surface of the fluorocarbon film with a rare gas plasma.

According to yet another aspect of the present invention, there is provided an interconnection structure which includes an interlayer insulating film having an insulating film formed on an underlayer, a contact hole formed in the interlayer insulating film, and a metal filled in the contact hole, the interlayer insulating film having an effective permittivity of 3 or less.

In the aspect of the present invention, it is preferable that the metal filled in the contact hole contains copper and a barrier layer including at least a layer of a fluoride of nickel is interposed between the interlayer insulating film and copper. The fluoride of nickel is, for example, nickel difluoride, but is not limited thereto. This fluoride of nickel is formed by MOCVD or is formed by forming a film of nickel by PVD (Physical Vapor Deposition) and then fluorinating the film. The interlayer insulating film is preferably a fluorocarbon film.

It is preferable that the insulating film includes a first fluorocarbon film formed on the underlayer and a second fluorocarbon film formed on the first fluorocarbon film and having a permittivity lower than that of the first fluorocarbon film, and that the first fluorocarbon film has a thickness of 5 to 10 nm while the second fluorocarbon film has a thickness of 280 to 500 nm. Specially, it is preferable that the permittivity of the second fluorocarbon film is 1.5 to 2.5. Furthermore, it is preferable that the underlayer includes at least one of an SiCN layer, an $Si_3N_4$ layer, and an $SiO_2$ layer formed on a base body. Herein, the first fluorocarbon film is provided for preventing generation of a silicon fluoride gas produced by a reaction with the underlayer.

Furthermore, it is preferable that the interconnection structure further includes a film formed on the fluorocarbon film and containing at least one of $Si_3N_4$, SiCN, and SiCO, and that a nitrided film is provided at a surface portion of the second fluorocarbon film.

According to a further aspect of the present invention, there is provided a method of manufacturing an interconnection structure. The method includes a first step of forming a first fluorocarbon film on an underlayer using a fluorocarbon gas and a rare gas whose plasma has an electron temperature lower than that of Ar, and a second step of forming a second fluorocarbon film on the first fluorocarbon film by a plasma generated by using an Ar gas.

Herein, it is preferable that the first fluorocarbon film is formed in a thickness of 5 to 10 nm while the second fluorocarbon film is formed in a thickness of 280 to 500 nm. Furthermore, it is also preferable that each of the first and the second fluorocarbon films has a low permittivity. Specially, it is preferable that the permittivity of the second fluorocarbon film is adjusted to 1.5 to 2.5.

Furthermore, it is preferable that the underlayer includes at least one of an SiCN layer, an $Si_3N_4$ layer, an SiCO layer, and an $SiO_2$ layer formed on a base body. It is also preferable that the rare gas used in the first step is a Xe gas.

Moreover, a film of at least one of $Si_3N_4$ or SiCN, and SiCO may be formed by adding at least one of a nitriding gas and an oxidizing gas to the rare gas, and flowing an $SiH_4$ gas as a reactive gas. It is preferable that a surface of the second fluorocarbon film is nitrided.

In the aspect of the present invention, it is preferable that the method includes, in addition to the first and the second steps, a step of forming a contact hole in the fluorocarbon films and a step of filling a metal in the contact hole. It is also preferable that the method further includes a step of forming a barrier layer for preventing diffusion of the metal filled in the contact hole.

According to a yet further aspect of the present invention, there is provided a method of cleaning a chamber, comprising, after generating a plasma in a pressure-reduced chamber to form a fluorocarbon film on a substrate placed in the chamber, generating a plasma using a mixed gas of hydrogen and oxygen in the chamber, thereby cleaning an inner wall of the chamber.

Effect of the Invention

According to this invention, it is possible to provide an interlayer insulating film of a semiconductor device, which has a low permittivity, is free from generation of gases such as CFx and $SiF_4$, and is stable, and a method of manufacturing it.

Further, according to this invention, it is possible to provide an interconnection structure comprising such an interlayer insulating film and a method of manufacturing it.

Further, according to this invention, by first forming a fluorocarbon film by plasma CVD using a Xe or Kr gas, it is possible to reduce outgassing of SiF-based gases and further to prevent stripping of the fluorocarbon film. Then, by forming a main portion of the fluorocarbon film by CVD in an Ar gas plasma, it is possible to reduce the effective permittivity of the fluorocarbon film.

Further, according to this invention, by nitriding the surface of the fluorocarbon film, there is an effect of largely reducing outgassing and there is also an effect of preventing stripping of an insulating film formed on the fluorocarbon film.

Further, according to this invention, by providing a barrier layer of nickel difluoride on the inner surface of a via hole or a contact hole, it is possible to prevent Cu in the hole from diffusing into the barrier layer.

DESCRIPTION OF SYMBOLS

| | |
|---|---|
| 1 | barrier cap layer |
| 2 | first interlayer insulating film |
| 2a | CFx film |
| 2b | CFx film |
| 3 | first adhesive layer |
| 4 | second interlayer insulating film |
| 5 | second adhesive layer |
| 6 | hard mask |
| 7 | via hole |
| 8 | electrode |
| 9 | trench |
| 10 | interconnection structure |
| 11 | interconnection conductor (Cu) |
| 12 | antenna |
| 13 | gas introducing pipe |
| 14 | silicon wafer |
| 21 | insulator plate |
| 22 | lower shower plate |
| 23 | upper shower plate |
| 24 | process chamber |
| 26 | introducing pipe |
| 30 | outgas measuring apparatus |
| 31 | process chamber |
| 32 | discharge electrode |
| 33 | pipe |
| 34, 35 | pipe |
| 36a, 36b | pipe |
| 37a, 37b | vacuum pump |
| 38 | exhaust pipe |
| 39 | arrow |
| 40 | heating furnace |
| 41 | heating heater |
| 42 | photoion detector |
| 44 | mass flow controller |
| 45 | arrow |
| 46 | sample |
| 47 | introducing pipe |
| 48 | pipe |
| 51 | valve |
| 52 | exhaust pipe |
| 53 | valve |
| 54 | valve |
| 56 | pipe |
| 57 | mass flow controller |
| 58 | mass flow controller |
| 59 | arrow |
| 61 | variable displacement control valve |
| 62a, 62b | mass flow meter |
| 63 | arrow |
| 64 | arrow |
| 65 | pipe |
| 66 | arrow |
| 71 | barrier cap layer |
| 72 | SiOC film |
| 73 | PAR (low-permittivity Si layer) |
| 74 | hard mask |
| 100 | interconnection structure |
| 102 | plasma processing apparatus |
| 103 | outgas measuring system |

BEST MODE FOR CARRYING OUT THE INVENTION

In order to facilitate understanding of this invention, a conventional interlayer insulating film structure of a semiconductor device according to prior art will be described with reference to FIG. 1 before describing an embodiment of this invention.

Figure 1:
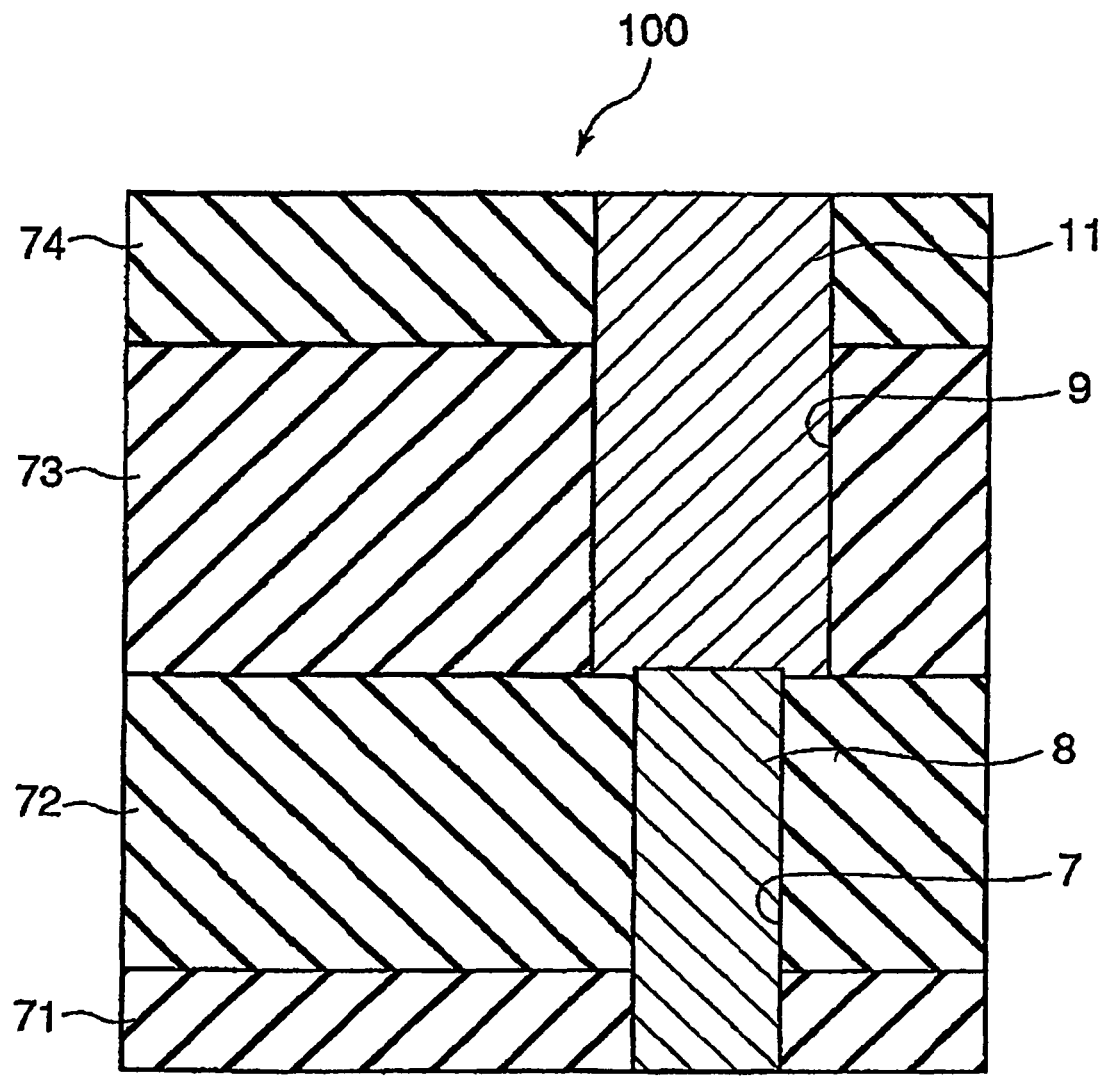
FIG. 1 is a diagram showing a conventional interlayer insulating film structure of a semiconductor device according to prior art.

Referring to FIG. 1, in the semiconductor device according to prior art, an interlayer insulating film structure (only one connecting portion between interconnection layers is shown) 100 provided on a semiconductor substrate (not shown) formed with a number of semiconductor elements comprises a barrier cap layer 71 of silicon carbide (SiC) or the like, a carbon-containing silicon oxide (SiOC) film 72 formed on the barrier cap layer 71, a via hole 7 provided in the SiOC film 72, a trench 9 provided in a PAR (low-permittivity silicon (Si) layer 73), and a hard mask 74 of silicon oxide (SiO$_2$) covering them. A metal such as Cu is buried in the via hole 7 to form an electrode or interconnection 8 and, at its upper end, Cu or the like is buried in the trench 9 to form an interconnection 11.

Now, the embodiment of this invention will be described with reference to the drawings.

Figure 2:
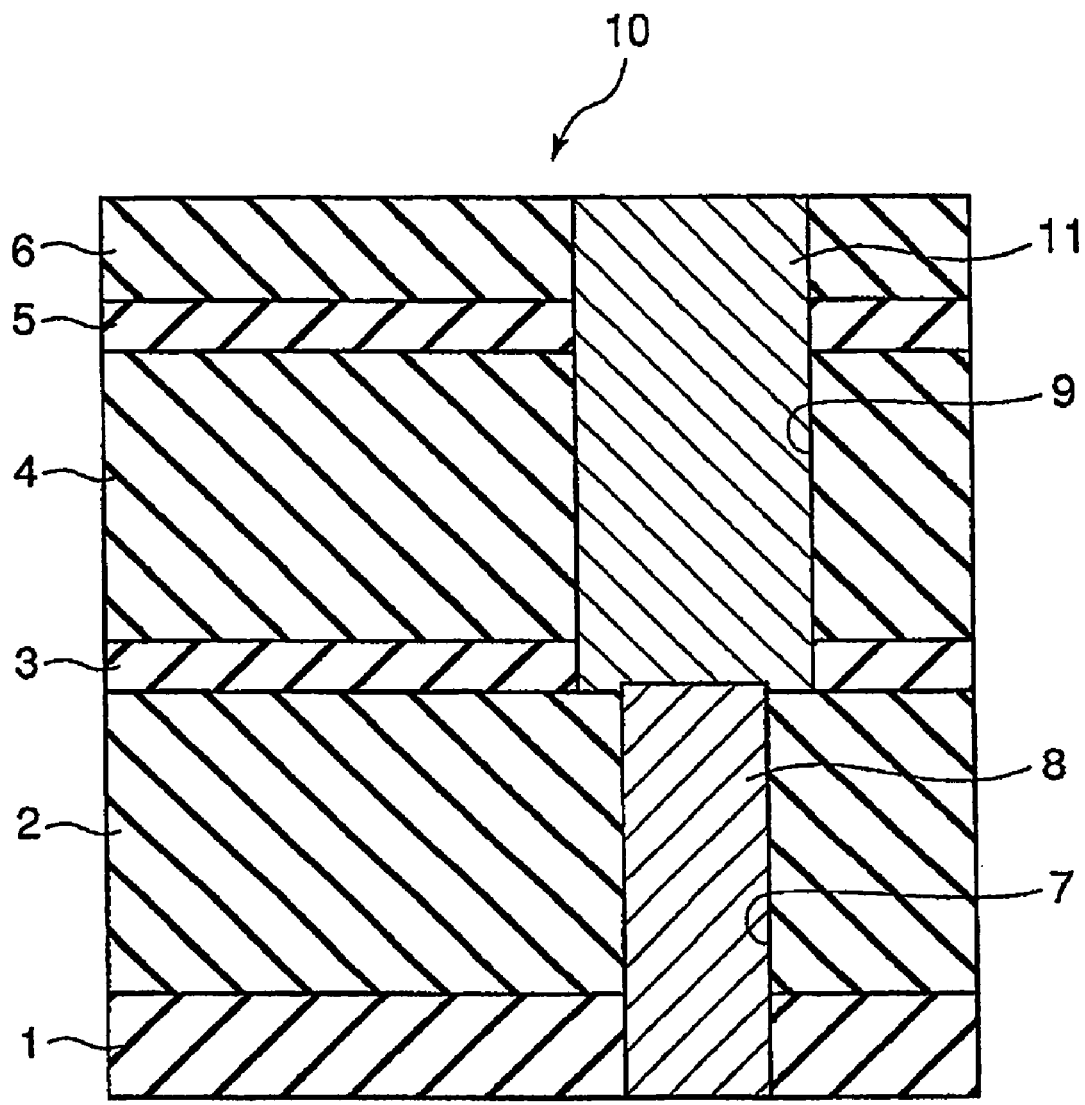
FIG. 2 is a diagram showing an interconnection structure according to an embodiment of this invention.

As shown in FIG. 2, in a semiconductor device according to the embodiment of this invention, a multilayer interconnection structure (only one connecting portion between interconnection layers is shown) 10 provided on a semiconductor substrate (not shown) formed with a number of semiconductor elements has a first interlayer insulating film 2 in the form of a fluorocarbon film (hereinafter referred to as a CFx film) formed on a barrier cap layer 1 of silicon carbonitride (SiCN).

A via hole 7 is provided so as to penetrate the first interlayer insulating film 2 and the barrier cap layer 1. An electrode or interconnection 8 of Cu is formed in the via hole 7. Further, a second interlayer insulating film 4 in the form of a fluorocarbon film is formed on the first interlayer insulating film 2 through a first adhesive layer 3 of SiCN. Further, a hard mask 6 of silicon oxide (SiO$_2$) is provided on the second interlayer insulating film 4 through a second adhesive layer 5 of SiCN.

Further, a trench 9 is provided from the hard mask 6 to the interlayer insulating film 2 and an interconnection conductor 11 of Cu is buried in this trench.

Herein, the barrier cap layer 1 and the first and second adhesive layers 3 and 5 each have a permittivity of about 4.0, but hydrocarbon with k smaller than 2.5 may be used as the barrier cap layer 1 and a thinner SiCO film with k=3.0 may be used as each adhesive layer.

The interlayer insulating films 2 and 4 are each in the form of the fluorocarbon (CFx) film with k=2.0 and it is possible to further form a fluorocarbon film with k=about 1.7.

Although the $SiO_2$ film with k=4.0 is used as the hard mask layer 6, it is possible to use an SiCO film with k smaller than 3.0.

Figure 3:
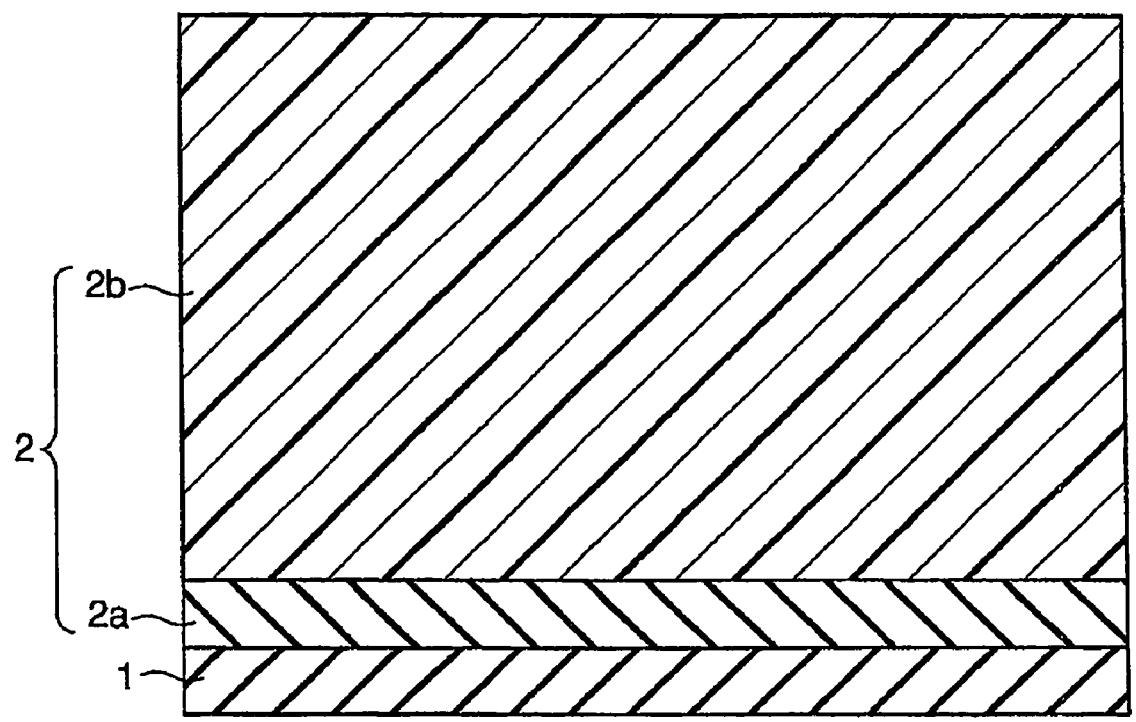
FIG. 3 is a schematic sectional view showing the structure of an interlayer insulating film used in the interconnection structure of FIG. 2.

Referring to FIG. 3, a thin CFx film 2a is formed by CVD on the underlayer 1 in the form of the SiCN layer by decomposition of a $C_5F_8$ gas using a Xe plasma and a thick CFx film 2b is formed by CVD on the CFx film 2a by decomposition of a $C_5F_8$ gas using an argon (Ar) plasma.

Further, after forming or annealing the CFx film 2b, the surface of the CFx film 2b is nitrided by nitrogen radicals produced by introducing an $N_2$ gas into an Ar gas plasma, thereby reducing outgassing from the CFx films. With this configuration, the film stripping is prevented and the permittivity can be controlled in a range of 1.7 to 2.2.

Figure 4:
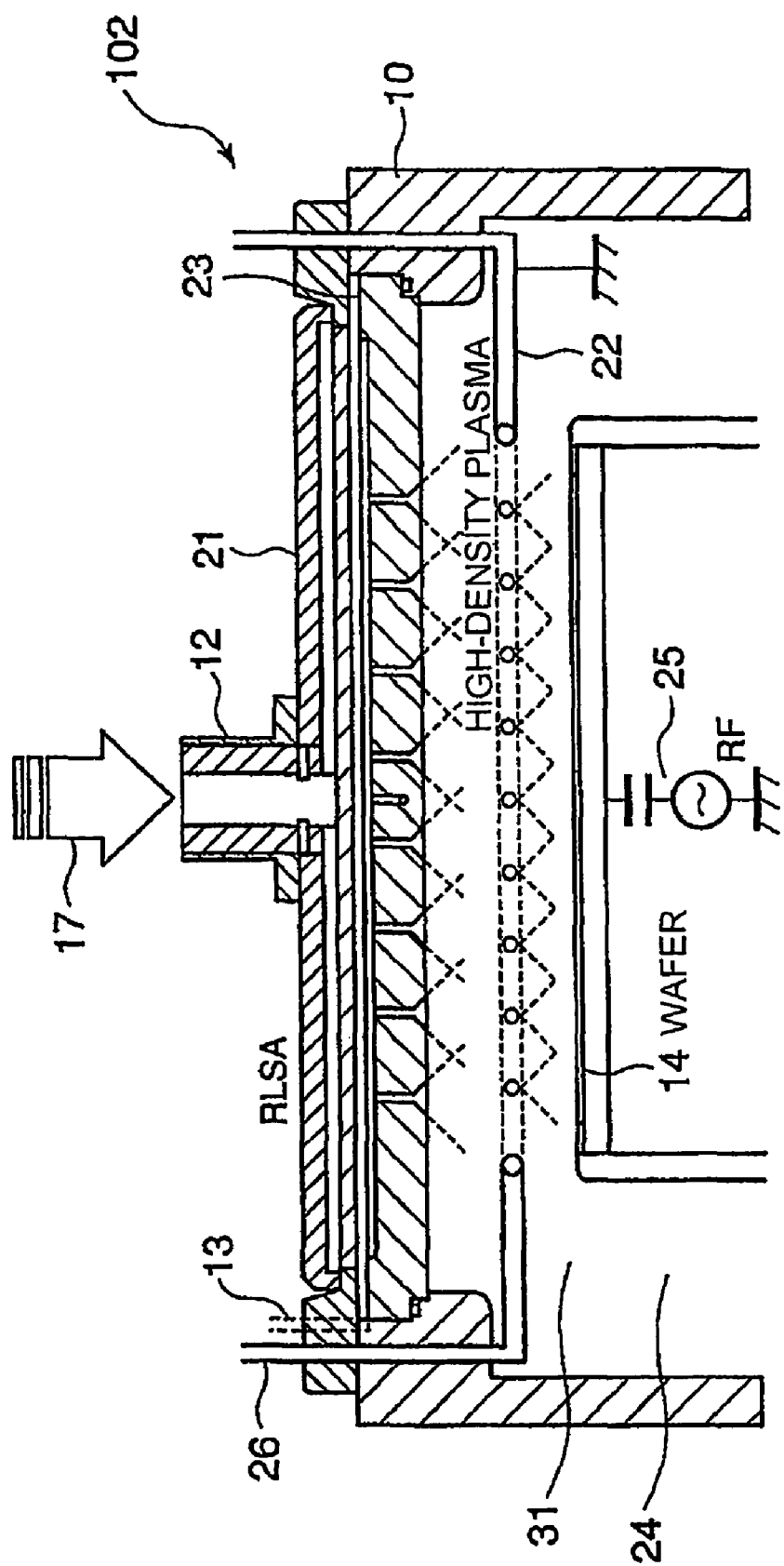
FIG. 4 is a schematic sectional view showing a plasma processing apparatus according to an embodiment of this invention.

Referring to FIG. 4, a microwave is radiated from a radial line slot antenna (RLSA) 12 disposed through an insulator plate 21 in the upper part of a plasma processing apparatus 102 and then is transmitted through the underlying insulator plate and a shower plate 23 into a plasma generating region. A Xe gas or an Ar gas is uniformly ejected into the plasma generating region from the upper shower plate 23 through a gas introducing pipe 13, so that a plasma is excited by the microwave radiated into the plasma generating region.

A lower shower plate 22 is disposed in a diffusion plasma region of the microwave-excited plasma processing apparatus.

Herein, if a Xe, Kr, or Ar gas is caused to flow into the upper shower plate 23 through the introducing pipe 13 and an $SiH_4$ gas is caused to flow into the lower shower plate 22 through an introducing pipe 26, a silicon ($SiO_2$) film can be formed on the surface of a substrate, for example, a silicon wafer, 14.

On the other hand, if a Kr, Xe, or Ar gas is caused to flow from the upper shower plate 23 and a CxFy ($C_5F_8$, $C_4F_8$, or the like) gas is caused to flow from the lower shower plate 22, a fluorocarbon film can be formed.

It is necessary that an oxygen gas or an $N_2/H_2$ or $NH_3$ gas be caused to flow from the upper shower plate 23 for oxidation or nitriding treatment, while, a mixed gas of an oxidizing gas and a nitriding gas, such as an $O_2/NH_3$, $O_2/N_2O$, or $O_2/NO$ gas, be caused to flow therefrom in the case of oxynitriding treatment.

The substrate (e.g. silicon wafer) 14, i.e. the object to be processed, is placed in a process chamber 24 at a place where a plasma is diffused and directly irradiated, and is oxidized by oxygen radicals or the like excited by the plasma. In this event, it is desirable that the object to be processed be placed not in a space where the plasma is excited, but in a space where the plasma is diffused, in the process chamber 24.

Exhaust gases in the process chamber 31 pass through an exhaust duct via non-illustrated exhaust ports and then are introduced into a small pump from its inlet ports.

Figure 5:
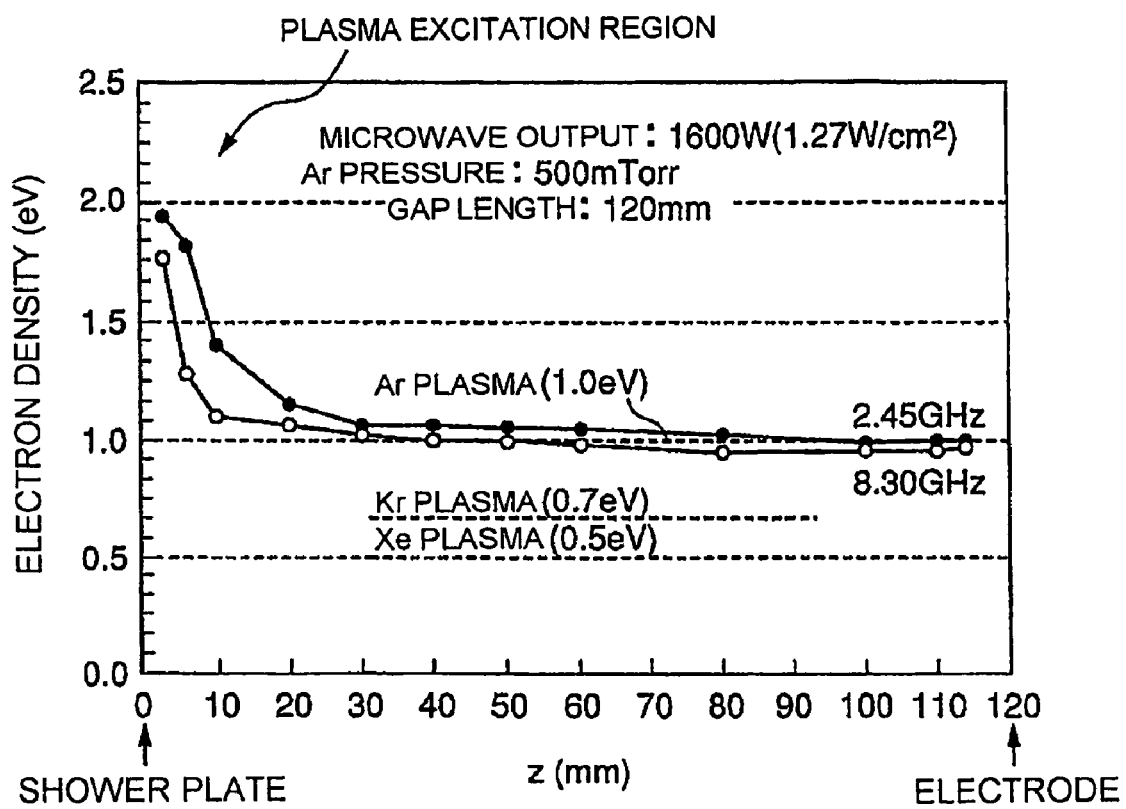
FIG. 5 is a diagram showing the relationship between the distance between a shower plate and an electrode, and the electron density (ev) for an Ar plasma, a Kr plasma, and a Xe plasma.

As shown in FIG. 5, the electron temperature becomes substantially constant when the distance between a shower plate and an electrode becomes 30 mm or more, and the electron temperature is lowered in the order of Ar, Kr, and Xe.

In any of the foregoing cases, since a Kr or Xe gas has, as compared with Ar, a smaller sectional area for collision with electrons and a smaller ionization energy where the electron temperature is low, when a microwave is irradiated to the Xe (or Kr) gas, the electron temperature of a plasma is lowered and thus it is possible to suppress damage to various formed films in the film formation and to suppress the etching action of a $C_5F_8$ gas.

Figure 6:
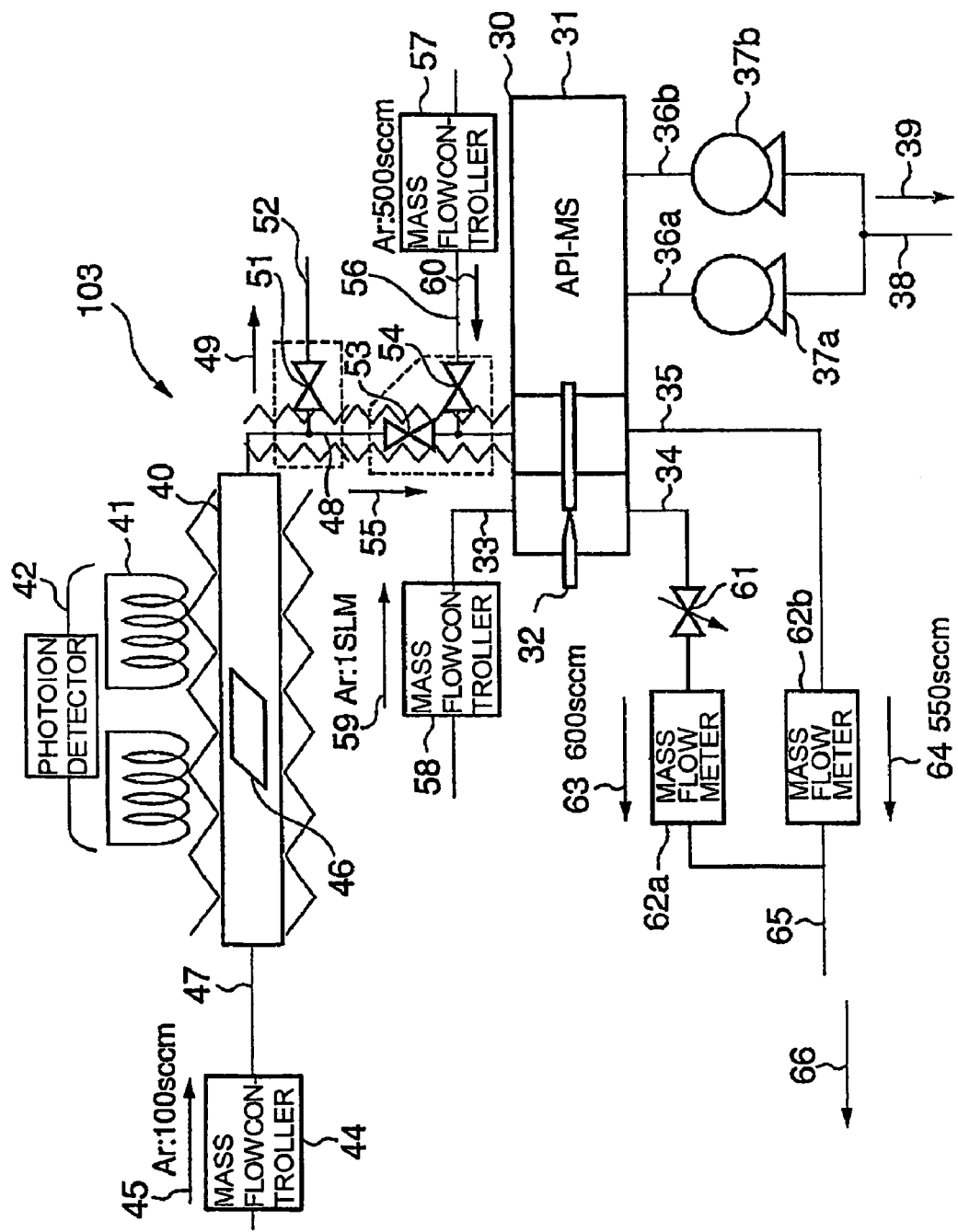
FIG. 6 is a diagram showing a schematic structure of an outgas measuring test apparatus.

Referring to FIG. 6, an outgas measuring system 103 comprises an outgas measuring apparatus 30 and a photoion measuring apparatus.

A sample 46 is placed in a heating furnace 40 of the photoion measuring apparatus. As indicated by an arrow 45, Ar is introduced as a carrier gas into the heating furnace 40 through an introducing pipe 47 while being adjusted to a flow rate of 100 sccm by a mass flow controller 44.

The heating furnace 40 is provided with heating heaters 41 and a photoion detector 42. Gases released from the sample 46 are introduced into the outgas measuring apparatus 30 through a pipe 48 provided with a valve 53. An exhaust pipe 52 provided with a valve 51 for exhaust is branched from the pipe 48.

The outgas measuring apparatus 30 is provided with a discharge electrode 32. Through pipes 36a and 36b provided with vacuum pumps 37a and 37b, respectively, and an exhaust pipe 38 where the pipes 36a and 36b join together, the gases inside the outgas measuring apparatus 30 are exhausted as indicated by an arrow 39. On the other hand, pipes 34 and 35 are respectively provided on the inside of the outgas measuring apparatus 30 and at its adjacent portion where the discharge electrode 32 is provided. The pipe 34 is exhausted at a flow rate of 600 sccm through a variable displacement control valve 61 and a mass flow meter 62a as indicated by an arrow 63. On the other hand, the pipe 35 is exhausted at a flow rate of 550 sccm through a mass flow meter 62b as indicated by an arrow 64. The two pipes 34 and 35 join together to be a pipe 65 and are exhausted as indicated by an arrow 66.

A pipe 33 provided with a mass flow controller 58 for introducing an Ar gas at 1 SLM as indicated by an arrow 59 is connected to the outgas measuring apparatus 30 at a position which is the same in the length direction as that of the pipe 34, but differs therefrom in the circumferential direction. The pipe 48 is provided with the valve 53 on a further downstream side as compared with the exhaust pipe 52 and a pipe 56 provided with a mass flow controller 57 for introducing an Ar gas for dilution at 500 sccm is connected to the pipe 48 through a valve 54 on a further downstream side. The pipe 48 is connected to the outgas measuring apparatus 30 at a position which is the same in the length direction as that of the exhaust pipe 35, but differs therefrom in the circumferential direction.

Next, the CFx film forming process according to the embodiment of this invention will be described in detail.

Referring to FIG. 3, in the CFx film forming process according to the embodiment of this invention, SiCN or SiCO is first formed as an underlayer by plasma treatment using $SiH_4/C_2H_4/N_2$ or $O_2$, or the like by the use of the apparatus shown in FIG. 4. Naturally, organic silane may be used instead of silane gas ($SiH_4$)/ethylene ($C_2H_4$).

Then, a thin first CFx film 2a of 5 to 10 nm is formed on the underlayer 1 by a Xe plasma using a fluorocarbon gas as a reactive gas.

Herein, as the fluorocarbon gas as the reactive gas, use can be made of unsaturated aliphatic fluoride expressed by a general formula $C_nF_{2n}$ (where n is an integer of 2 to 8) or $C_nF_{2n-2}$ (n is an integer of 2 to 8), but is preferably made of fluorocarbon expressed by a general formula $C_5H_8$, such as carbon fluoride containing octafluoropentyne, octafluoropentadiene, octafluorocyclopentene, octafluoromethylbutadiene, octafluoromethylbutyne, fluorocyclopropene, or fluorocyclopropane, or carbon fluoride containing fluorocyclobutene or fluorocyclobutane.

Further, switching the Xe gas to an Ar gas, a second CFx film 2b having a thickness of 380 to 500 nm is formed on the first CFx film 2a by an Ar plasma using a $C_5F_8$ gas as a reactive gas. Since the permittivity of a CFx film is reduced when formed using a plasma of Ar gas, this makes it possible to reduce the permittivity of the CFx film 2 to as low as 1.7 to 2.2.

After forming the fluorocarbon films on the substrate, it is possible to carry out cleaning of the inner wall of the chamber by generating a plasma using a mixed gas of hydrogen and oxygen in the chamber.

Further, after the film formation or annealing, the surface of the CFx film is nitrided by an Ar/$N_2$ plasma or an $N_2$ plasma. This makes it possible to reduce outgassing from the CFx films.

Preferably, annealing is performed after the film formation and before the surface nitriding. In this specification, the annealing may be performed in the plasma chamber with the substrate as it is without exposing the substrate to the atmosphere or may be performed using a separate annealing apparatus. In either case, an atmosphere is set to an inert gas atmosphere and the pressure may be set to an atmospheric pressure but is preferably set to a reduced pressure of about 1 Torr. As will be described later, it is preferable that the fluorocarbon film be irradiated with an Ar plasma before or after the annealing.

A description will be given of a method of manufacturing the interconnection structure of FIG. 2. As shown in FIG. 2, a first interlayer insulating film 2 shown in FIG. 3 is formed using a barrier cap layer 1 as an underlayer. A via hole 7 is formed in the first interlayer insulating film 2 by etching. Then, as a barrier layer for preventing diffusion of an electrode metal into the interlayer insulating film, a film of a fluoride of nickel, preferably a nickel difluoride (referred to as $NiF_2$) film is formed on the inner wall of the via hole 7 by forming a film of nickel by PVD and then fluorinating it, or is directly formed thereon by MOCVD.

Then, likewise, an SiCN layer or a carbon-containing silicon oxide (SiCO) layer is formed as an underlayer 3 in the form of an adhesive layer and, thereon, an interlayer insulating film 4 comprising a first and a second CFx film is formed in the same manner as shown in FIG. 3. On this interlayer insulating layer 4, an SiCN layer or an SiCO layer is further formed as an underlayer 3 for adhesion and, on this underlayer 3, an $SiO_2$ or SiCO layer is formed as a hard mask layer 6.

Herein, the $SiO_2$ layer can be formed by introducing a mixed gas of Ar and $O_2$ from the upper shower plate 23 and introducing an $SiH_4$ gas from the lower shower plate 22 in the plasma processing apparatus 102 shown in FIG. 4. The SiCO layer is the same as described before.

Then, a trench 9 is formed by etching, a non-illustrated $NiF_2$ barrier layer is formed on the inner wall surface of the trench 9, and Cu is filled as a metal in the trench 9 to form an interconnection conductor 11, so that the interconnection structure 10 is completed.

Herein, a description will be given of release of SiFx gases when an underlayer 1 is made of a silicon compound and a CFx film is formed thereon.

SiFx gases are produced by reactions at the interface between a layer of Si, $SiO_2$, $Si_3N_4$, or the like and a CFx film.

Table 1 below shows the ionization potentials of outgases. As shown in Table 1, it is seen that the ionization potential of SiFx increases in the order of SiF, $SiF_3$, $SiF_2$, and $SiF_4$.

TABLE 1

| Element | m/z | Ionization Potential (eV) |
|---|---|---|
| Ar | 40 | 15.8 |
| $SiF_4$ | 104 | 15.7 |
| $H_2$ | 2 | 15.4 |
| $N_2$ | 28 | 15.6 |
| $O_2$ | 32 | 12.1 |
| $H_2O$ | 18 | 12.6 |
| $SiF_2$ | 66 | 10.78 |
| $SiF_3$ | 85 | 9.3 |
| SiF | 47 | 7.298 |

The release of SiFx gases depends on an underlayer in the initial film formation.

Figure 7:
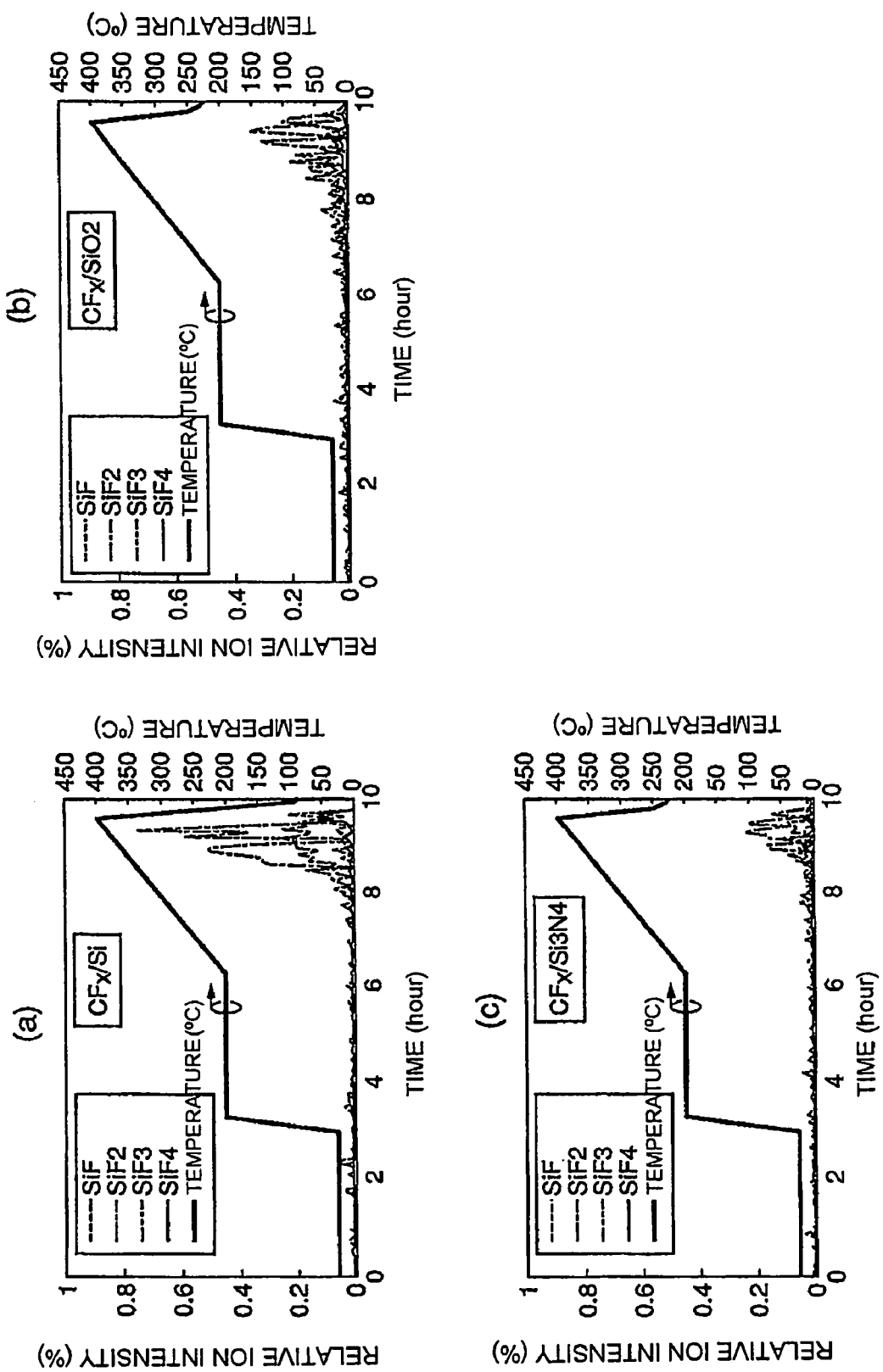
FIG. 7 represents diagrams showing the underlayer dependence of SiFx outgassing, wherein (a) shows a CFx film formed on a Si underlayer (CFx/Si), (b) shows a CFx film formed on an $SiO_2$ underlayer (CFx/$SiO_2$), and (c) shows a CFx film formed on an $Si_3N_4$ underlayer (CFx/$Si_3N_4$).

FIG. 7 represents diagrams showing the temperature dependence of SiFx outgassing per different underlayer, wherein the left scale shows the outgas amount when the temperature represented by the right scale is applied, with the lapse of time, to (a) a CFx film formed on a Si underlayer (CFx/Si), (b) a CFx film formed on an $SiO_2$ underlayer (CFx/$SiO_2$), and (c) a CFx film formed on an $Si_3N_4$ underlayer (CFx/$Si_3N_4$). As shown in FIGS. 7(a), (b), and (c), it is seen that the SiFx outgassing changes by changing the underlayer. It has been found that the reactions at the CFx/underlayer interface are such that the outgassing decreases in amount in the order of Si, $SiO_2$, and $Si_3N_4$.

Figure 8:
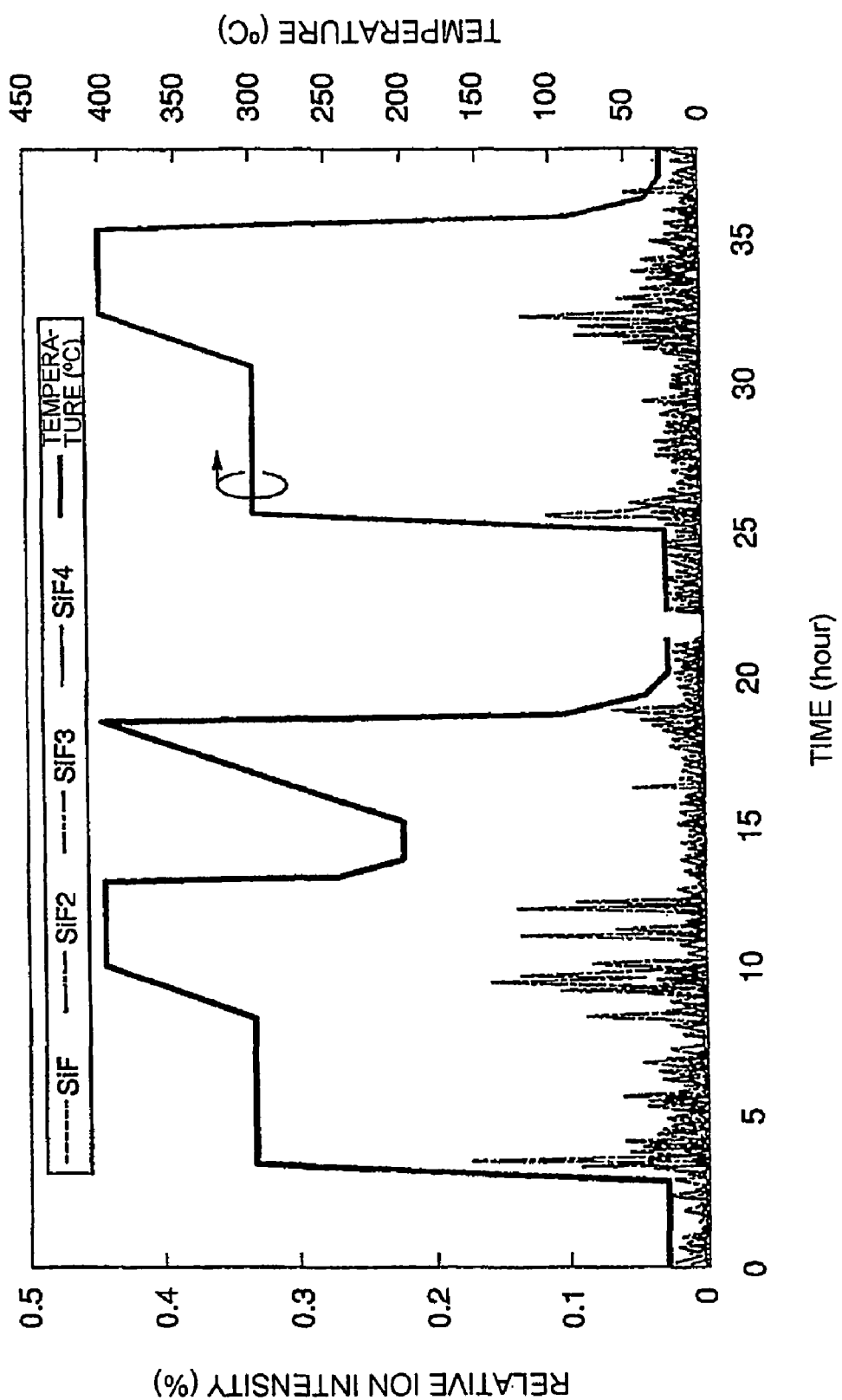
FIG. 8 is a diagram showing the temperature dependence of SiF-based gas amounts.

FIG. 8 is a diagram showing the temperature dependence of SiF-based outgas amounts. As shown in FIG. 8, it is seen that reactions occur at the interface between $SiO_2$ and CFx to produce SiFx outgases. Therefore, it is understood that it is essential to suppress the interfacial reactions. A further detailed investigation was made of $SiF_4$.

Figure 9:
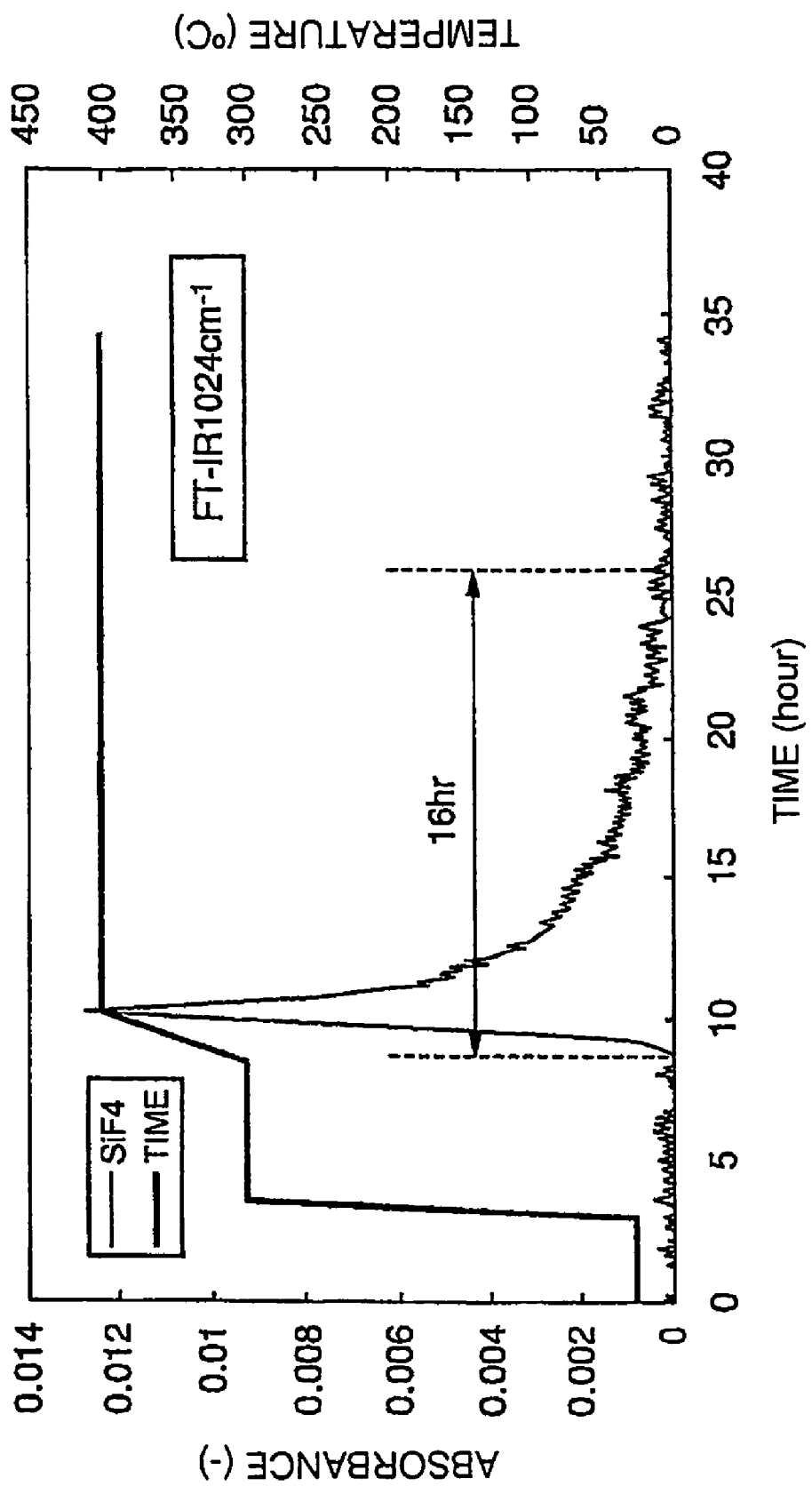
FIG. 9 is a diagram showing time-dependent changes of $SiF_4$ spectra.

FIG. 9 is a diagram showing time-dependent changes of $SiF_4$ spectra. Referring to FIG. 9, it is seen that, in the outgas measurement using a standard CFx film, when the temperature is raised with CFx/$SiO_2$, $SiF_4$ is produced and continues to be produced for 16 hours. Therefore, it is seen that it is essential to suppress the reactions at the CFx film/$SiO_2$ interface.

Next, an investigation was made of the temperature dependence of SiF-based outgas amounts for a CFx film formed on such an underlayer.

Figure 10:
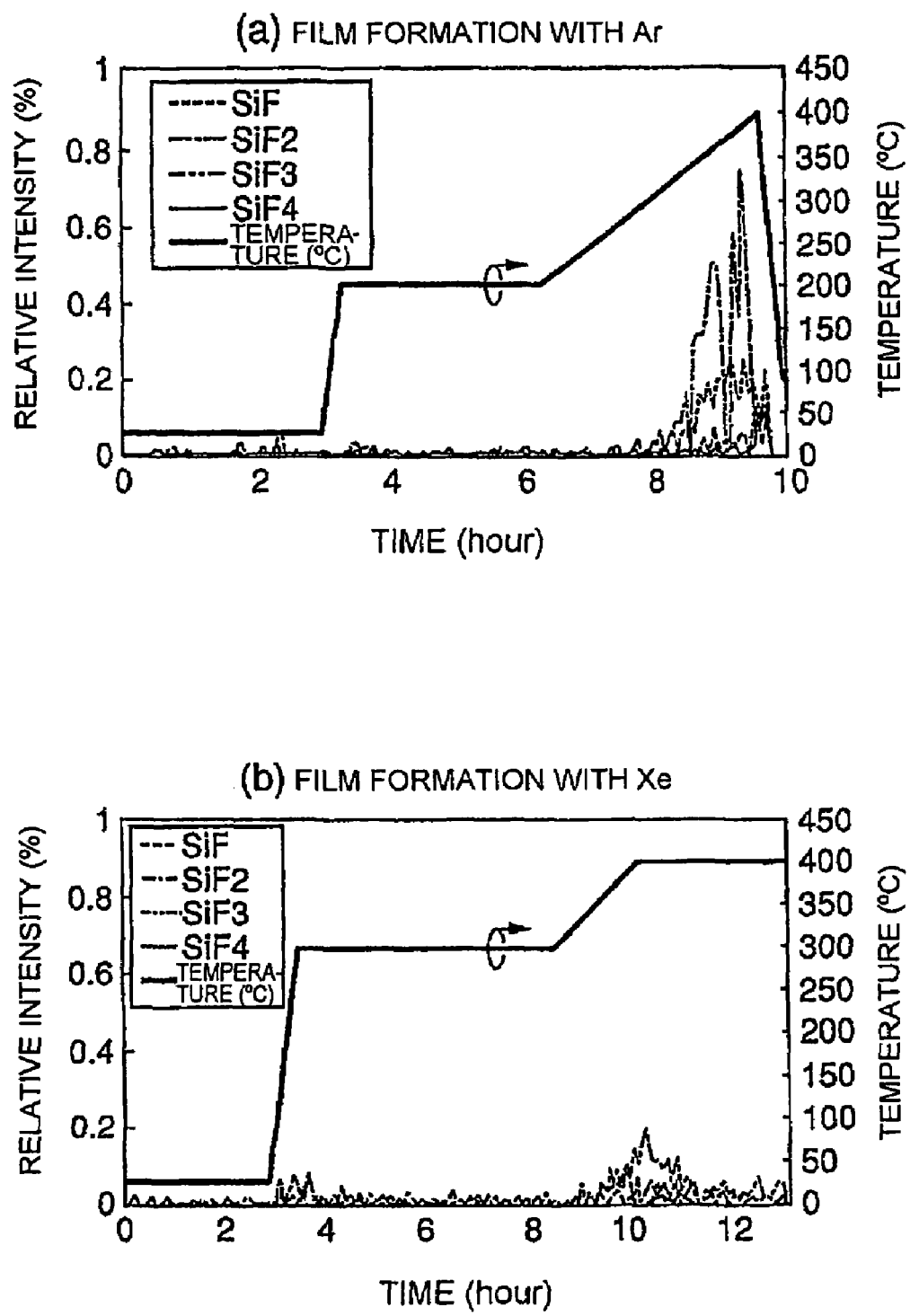
FIG. 10 represents diagrams showing the temperature dependence of SiF-based outgas amounts, wherein (a) shows the temperature dependence of outgas amounts in the case of film formation using Ar and (b) shows it in the case of film formation using Xe.

FIG. 10 represents diagrams showing the temperature dependence of SiF-based outgas amounts, wherein (a) shows the temperature dependence of outgas amounts in the case of film formation using Ar and (b) shows it in the case of film formation using Xe. The conditions were pressure 4 Pa (30 mTorr), 900 W, and X-ray diffractometer (SSY−1)/Ar(Xe) =10/240 (210) sccm.

From FIG. 10(a) and FIG. 10(b), it has been found that the SiF-based outgassing can be reduced by performing the film formation using a Xe-diluted gas as compared with the case where the film formation is performed using Ar as a dilution gas. That is, it has been found that the low electron temperature is essential for reducing the outgassing.

Next, the temperature dependence of SiFx outgas amounts was investigated by using Xe in the initial film formation on a Si underlayer and then switching it to Ar.

Figure 11:
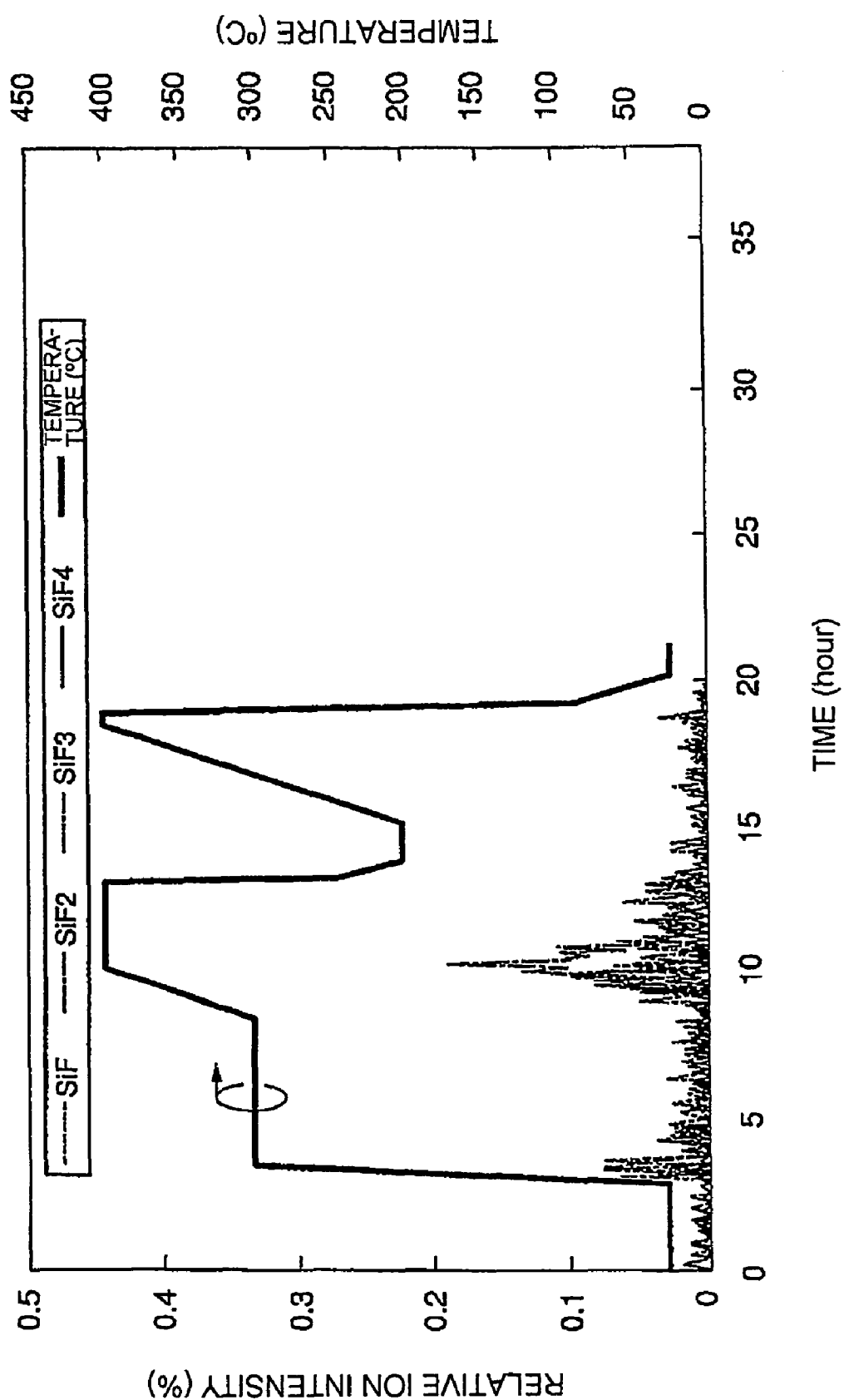
FIG. 11 is a diagram showing the temperature dependence of SiFx gas amounts when an underlayer is made of Si.

FIG. 11 is a diagram showing the temperature dependence of SiFx gas amounts when an underlayer is made of Si. The conditions were such that, using $C_5F_8$ as a reactive gas, film formation was performed by plasma treatment using Xe at 26.6 Pa (200 mTorr) for 5 seconds, then film formation was performed by plasma treatment using Ar at 26.6 Pa (200 mTorr) and, after annealing, treatment was performed using Ar at 26.6 Pa (200 mTorr) for 5 seconds. As shown in FIG. 11, it has been found that the SiFx gases can be reduced by using Xe in the initial film formation.

Figure 12:
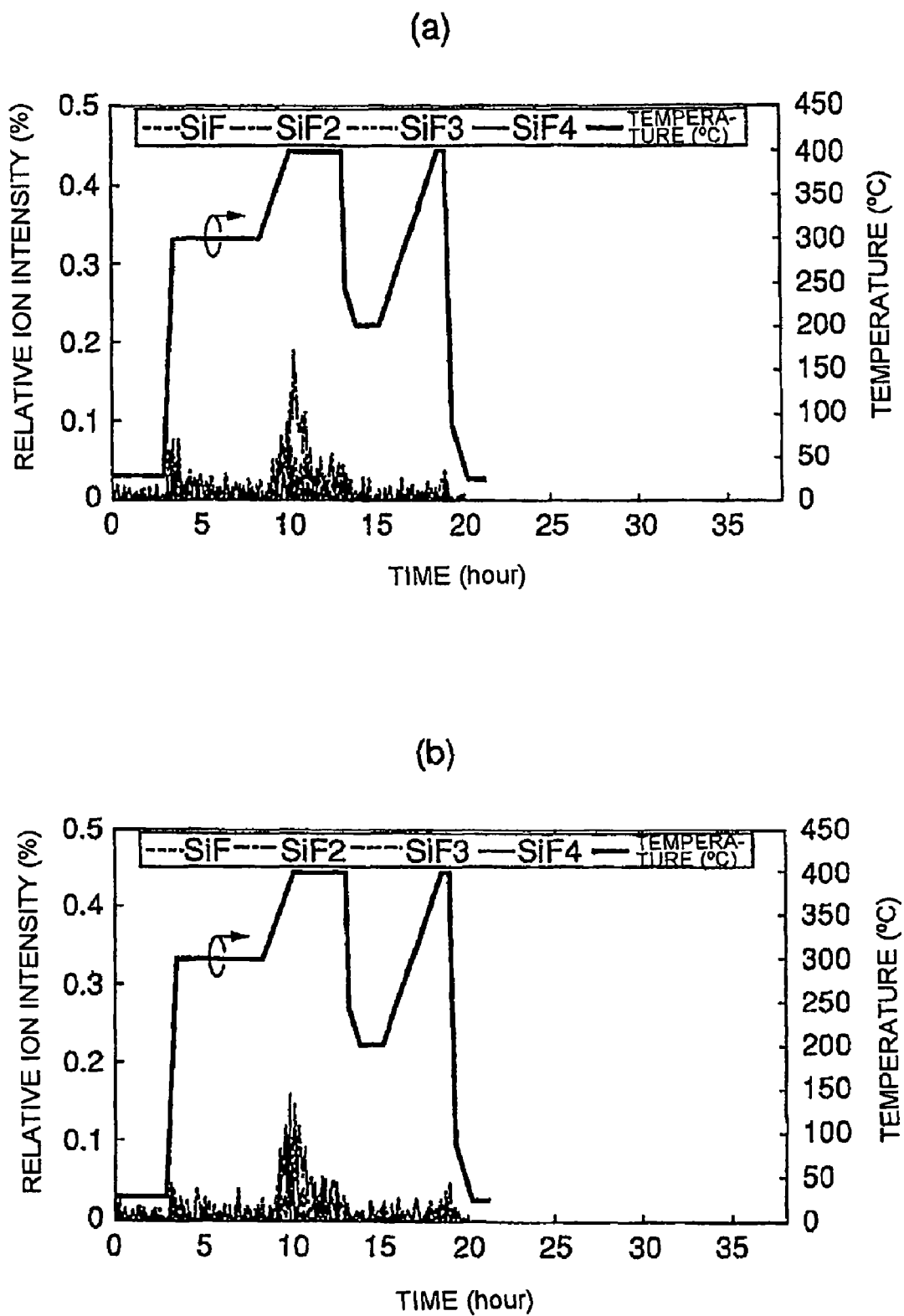
FIG. 12 represents diagrams showing the temperature dependence of SiFx-based outgas amounts, wherein (a) shows the outgas amounts from a CFx film obtained by treatment with $C_5F_8$/Xe at 26.6 Pa (200 mTorr) for 5 seconds, then treatment with $C_5F_8$/Ar at 26.6 Pa (200 mTorr) and, after annealing, treatment with Ar at 26.6 Pa (200 mTorr) for 5 seconds and (b) shows the outgas amounts from a CFx film obtained by treatment (5 seconds) in which a Xe plasma is on and $C_5F_8$ is introduced, then, after the introduction of $C_5F_8$ is off and the Xe plasma is off, Ar/$C_5F_8$ treatment for 3 minutes and then Ar+$N_2$ treatment for 5 seconds.

FIG. 12 represents diagrams showing the temperature dependence of SiFx-based outgas amounts, wherein (a) shows the outgas amounts from a CFx film obtained by treatment with $C_5F_8$/Xe at 26.6 Pa (200 mTorr) for 5 seconds, then treatment with $C_5F_8$/Ar at 26.6 Pa (200 mTorr) and, after annealing, treatment with Ar at 26.6 Pa (200 mTorr) for 5 seconds and (b) shows the outgas amounts from a CFx film obtained by treatment (5 seconds) in which a Xe plasma is on and $C_5F_8$ is introduced, then, after the introduction of $C_5F_8$ is off and the Xe plasma is off, Ar/$C_5F_8$ treatment for 3 minutes and then Ar+$N_2$ treatment for 5 seconds.

From FIG. 12(a) and FIG. 12(b), it is seen that the SiFx gases are reduced by using Xe in the initial film formation and carrying out the interface control.

Next, the temperature dependence of SiF4 outgas amounts was investigated by similarly forming a CFx film on a Si underlayer while changing the conditions.

Figure 13:
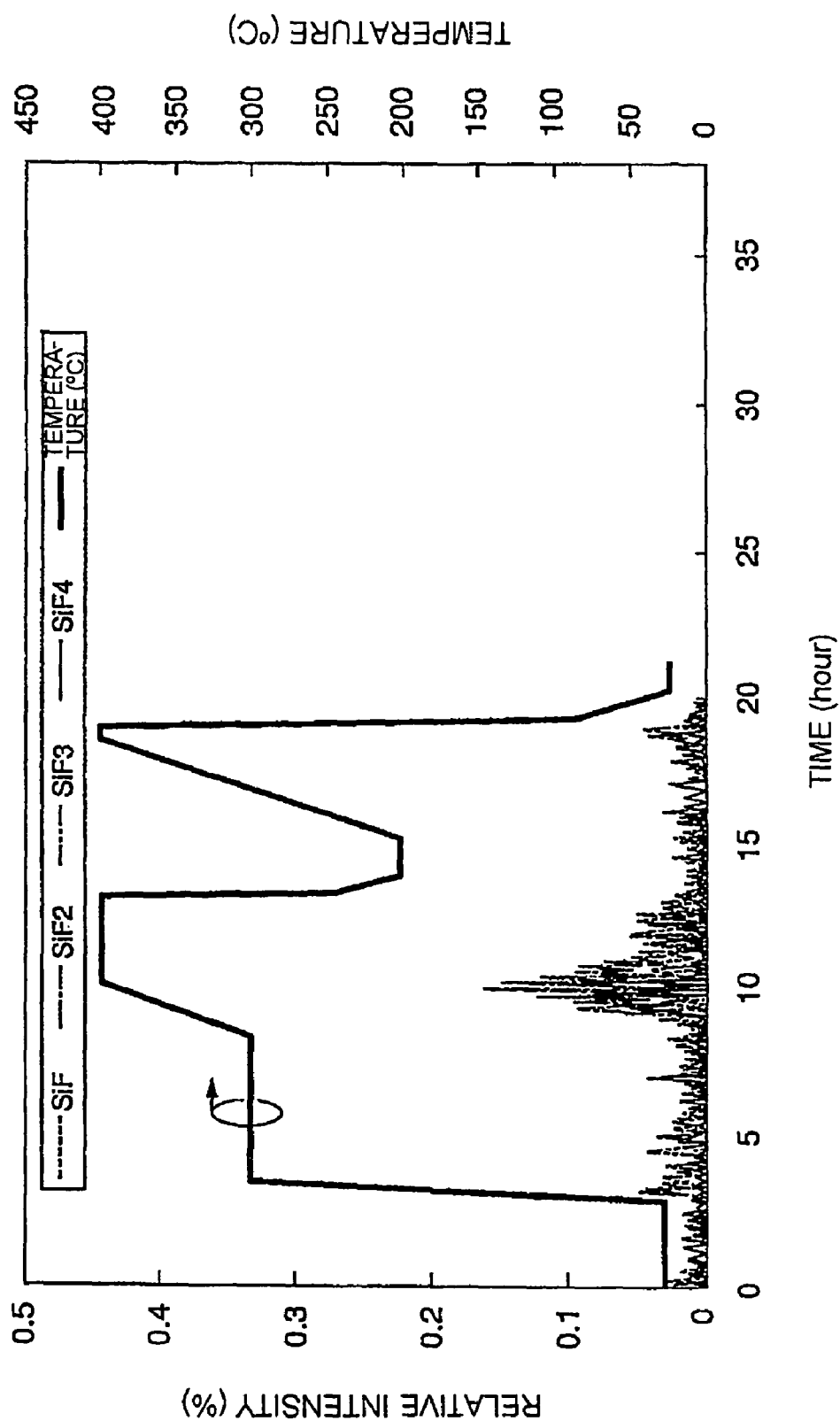
FIG. 13 shows the temperature dependence of SiFx outgas amounts when an underlayer is made of Si.

FIG. 13 shows the temperature dependence of SiFx outgas amounts when an underlayer is made of Si. In the process, treatment was performed for 5 seconds while a Xe plasma was on and a $C_5F_8$ gas was introduced, then the $C_5F_8$ gas was off and the Xe plasma was off, then Ar/$C_5F_8$ treatment was performed for 3 minutes, and subsequently, Ar+$N_2$ surface nitriding treatment was performed for 5 seconds. From FIG. 13, it is seen that the SiFx outgas amounts can be reduced by changing the sequence.

Further, an investigation was made of the TDS outgas spectra of a CFx film formed by an Ar plasma.

Figure 14:
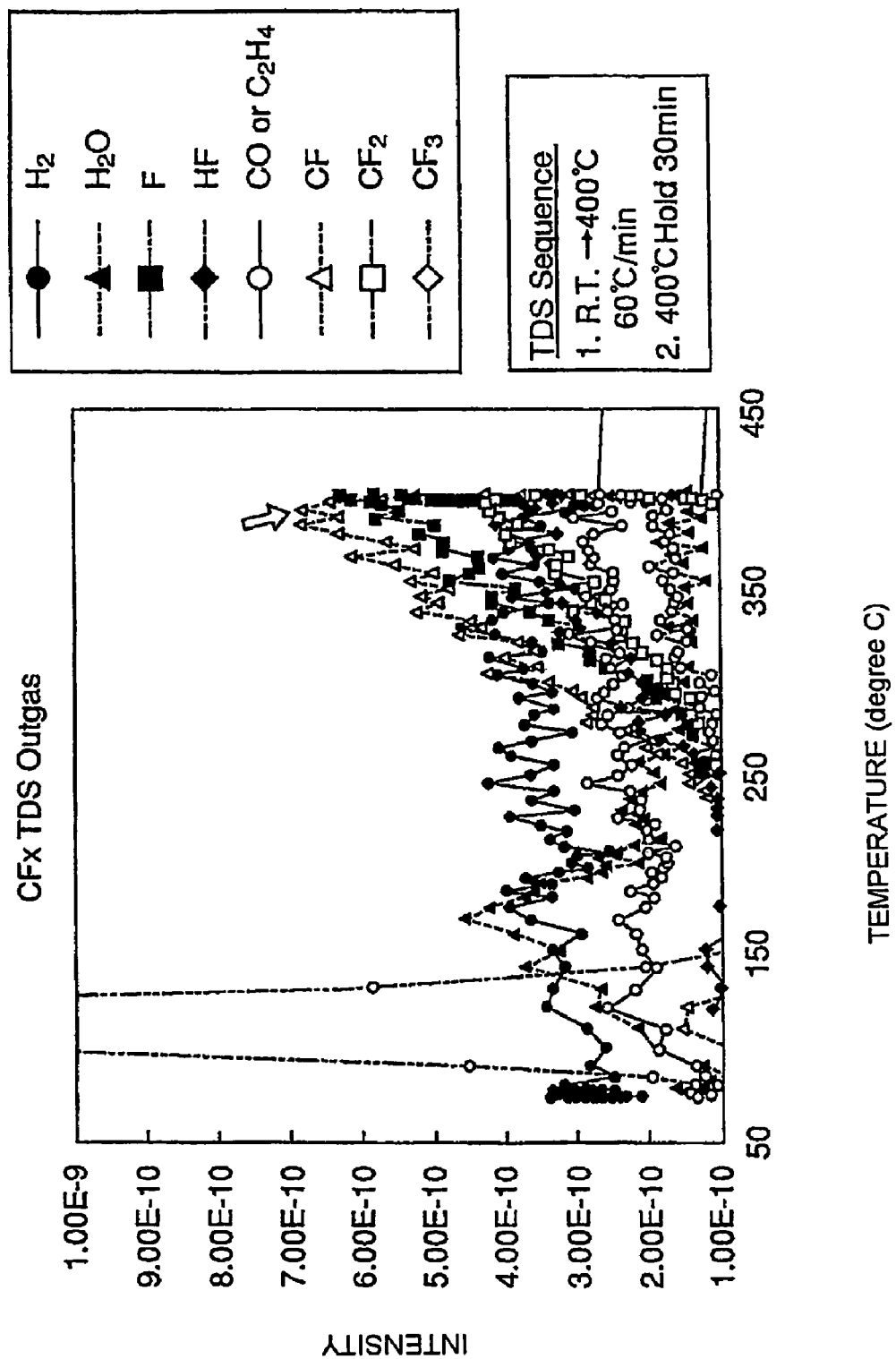
FIG. 14 is a diagram showing the TDS outgas spectra of a CFx film of 120 nm formed on a Si underlayer.

FIG. 14 is a diagram showing the TDS outgas spectra of a CFx film of 120 nm formed on a Si underlayer. As shown in FIG. 14, it is seen that when the temperature is raised at a heating rate of 60° C./min from room temperature to 400° C., CF-based outgases and so on are produced.

Figure 15:
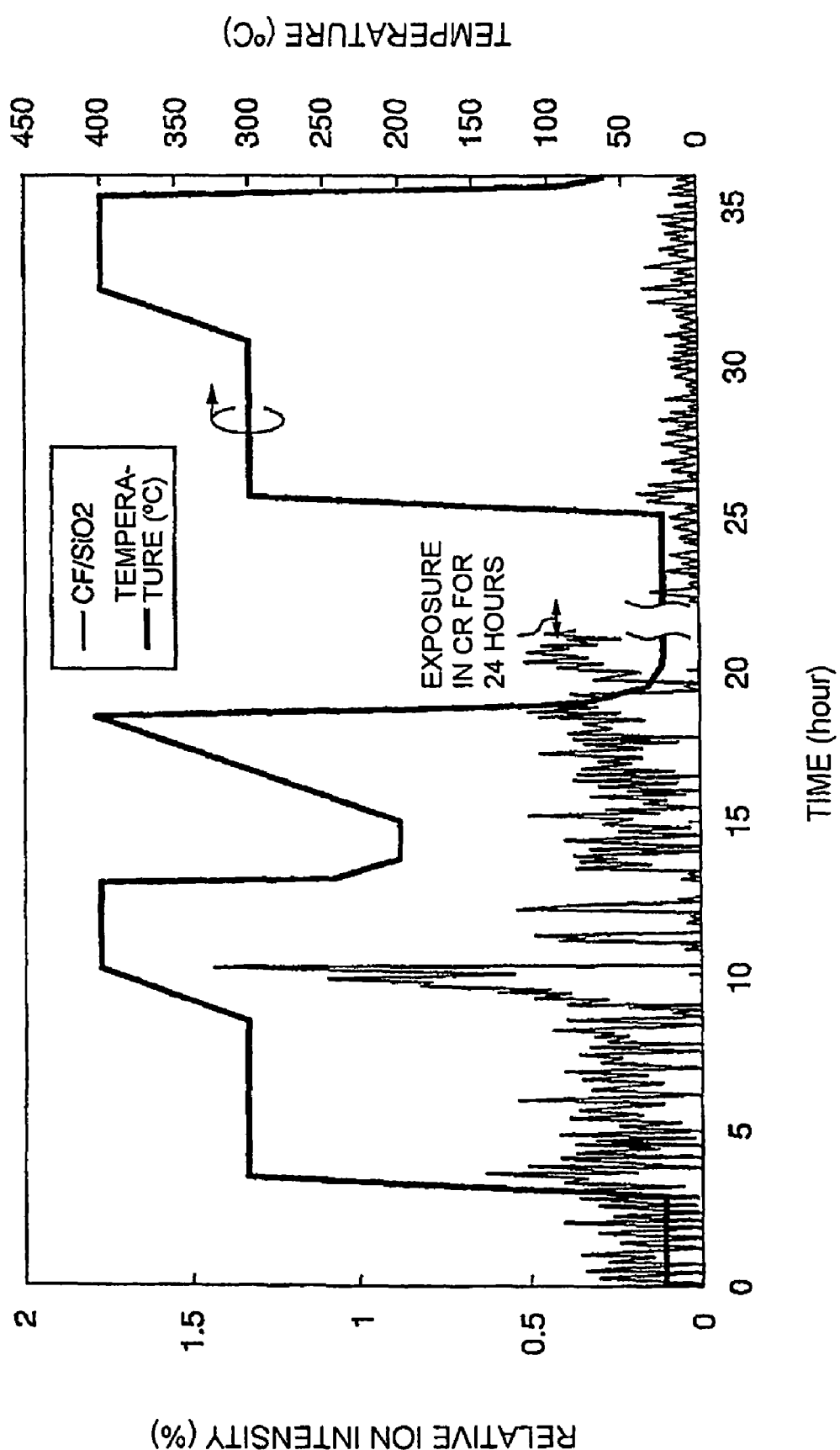
FIG. 15 is a diagram showing the temperature dependence of CFx outgas amount, after annealing, of a CF film formed on an $SiO_2$ underlayer.

FIG. 15 is a diagram showing the temperature dependence of CFx outgas amount, after annealing, of a CF film formed on an $SiO_2$ underlayer. As shown in FIG. 15, it has been found that, by removing insufficiently bonded components through annealing, subsequent decomposition reactions do not occur, thus confirming that the annealing is necessary.

Figure 16:
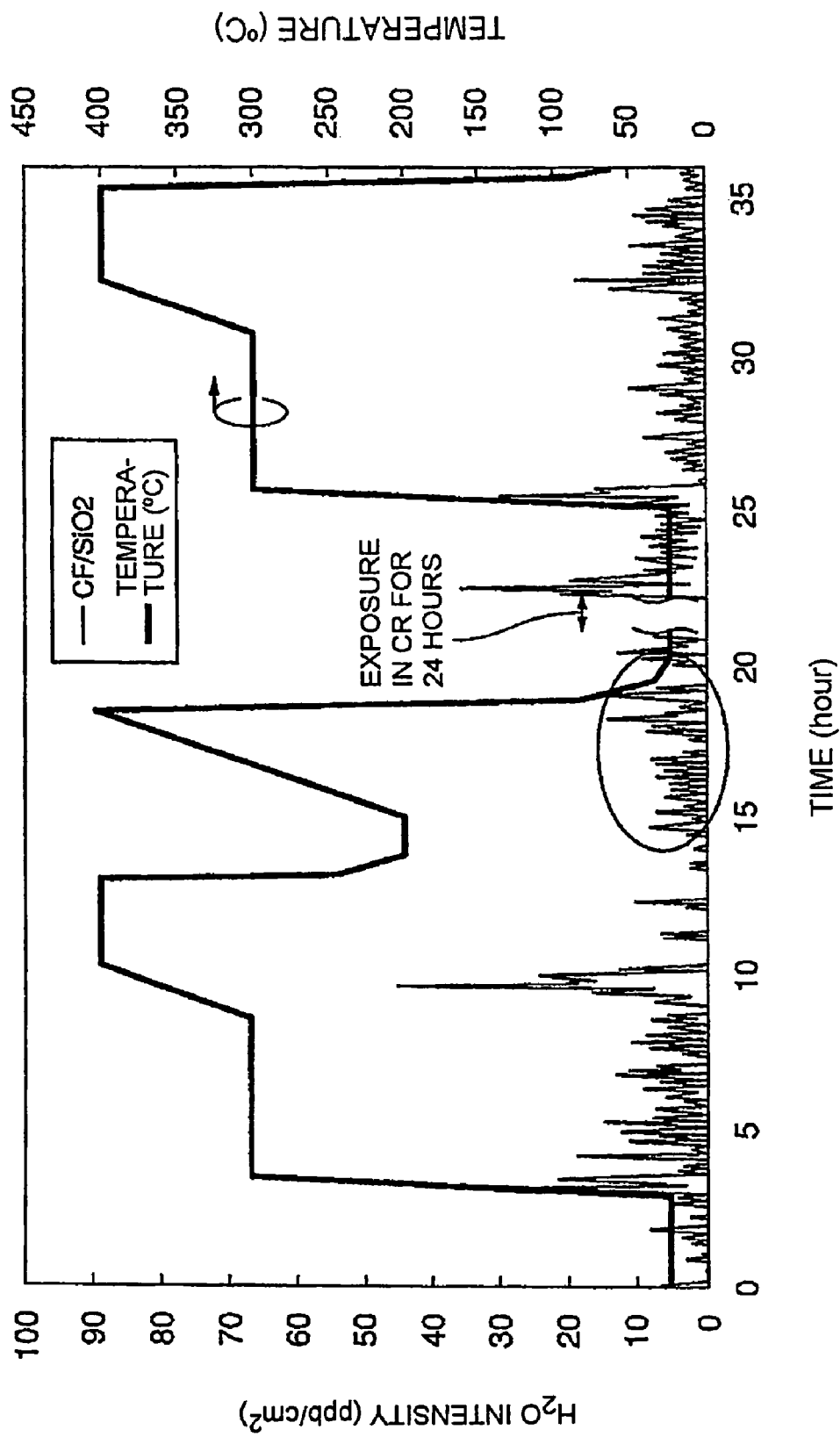
FIG. 16 is a diagram showing the temperature dependence of released water amount, after CF-film annealing, of a CF film formed on an $SiO_2$ underlayer in the same manner.

FIG. 16 is a diagram showing the temperature dependence of released water amount, after CF-film annealing, of a CF film formed on an $SiO_2$ underlayer in the same manner. As shown in FIG. 16, it has been found that, once heated, there is no generation of water in an in-situ process, and thus it is seen that the in-situ process is essential.

Figure 17:
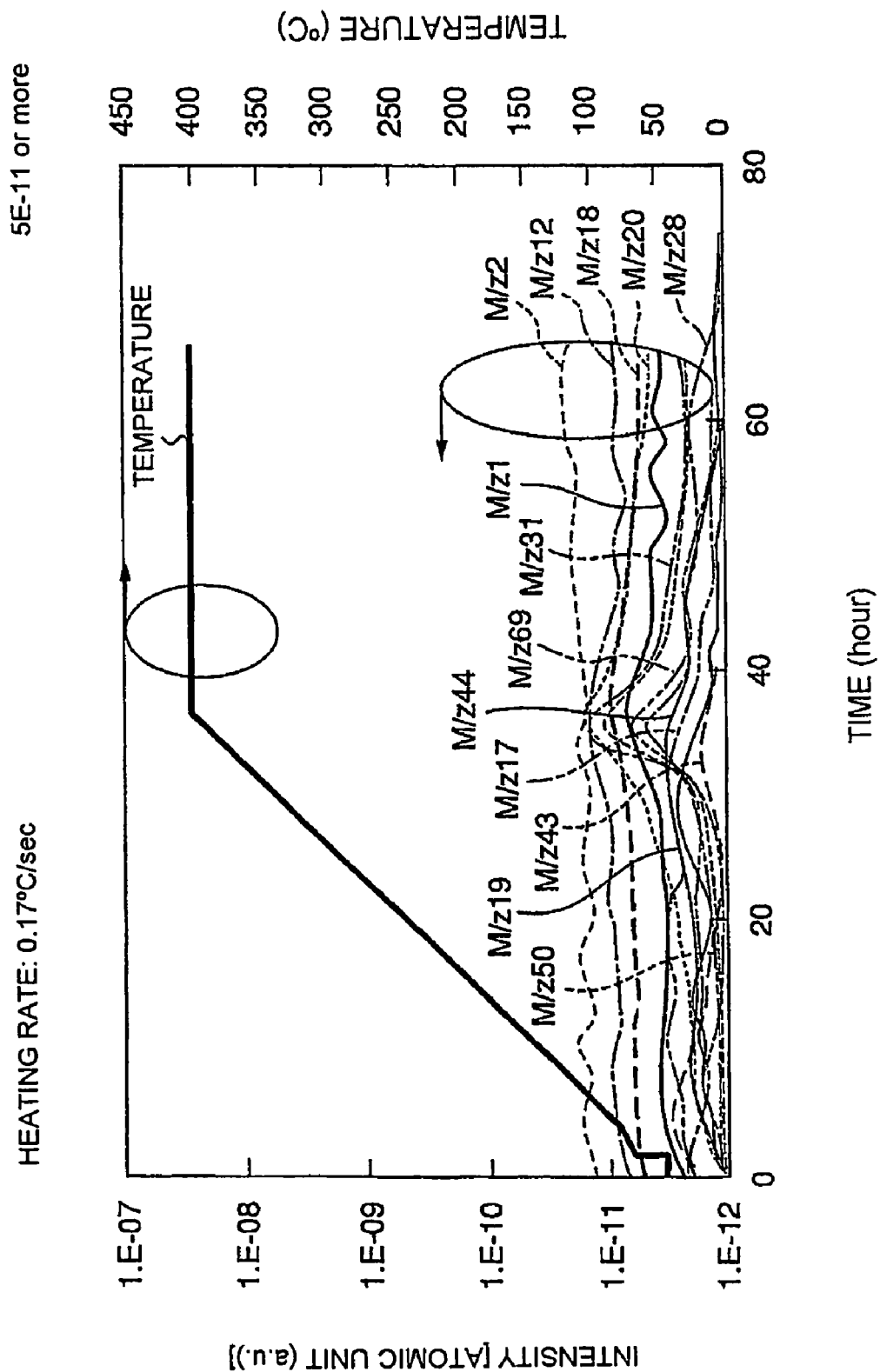
FIG. 17 is a diagram showing the fluorocarbon outgas characteristics after Ar/$N_2$ plasma treatment using the apparatus of FIG. 5 and the results of thermal desorption spectrometry (TDS) measurement.

FIG. 17 is a diagram showing the fluorocarbon outgas characteristics after Ar/$N_2$ plasma treatment using the apparatus of FIG. 5 and the results of thermal desorption spectrometry (TDS) measurement. The heating rate is 0.17° C./sec. The sample shown in FIG. 5 shows the outgas characteristics of a CFx film formed at 220° C. using straight-chain $C_5F_8$ as a reactive gas shown in FIG. 4 and then in-situ annealed at 330° C.

As shown in FIG. 17, the heating was stopped after 40 seconds from the start of the heating, so that the temperature was maintained at a constant value of 400° C. It is seen that the release extremely increases near 350° C. and becomes maximum at a temperature somewhat lower than 400° C.

Next, the temperature dependence of outgas amount of a CFx film was investigated by introducing $C_5F_8$ in Ar-plasma treatment.

Figure 18:
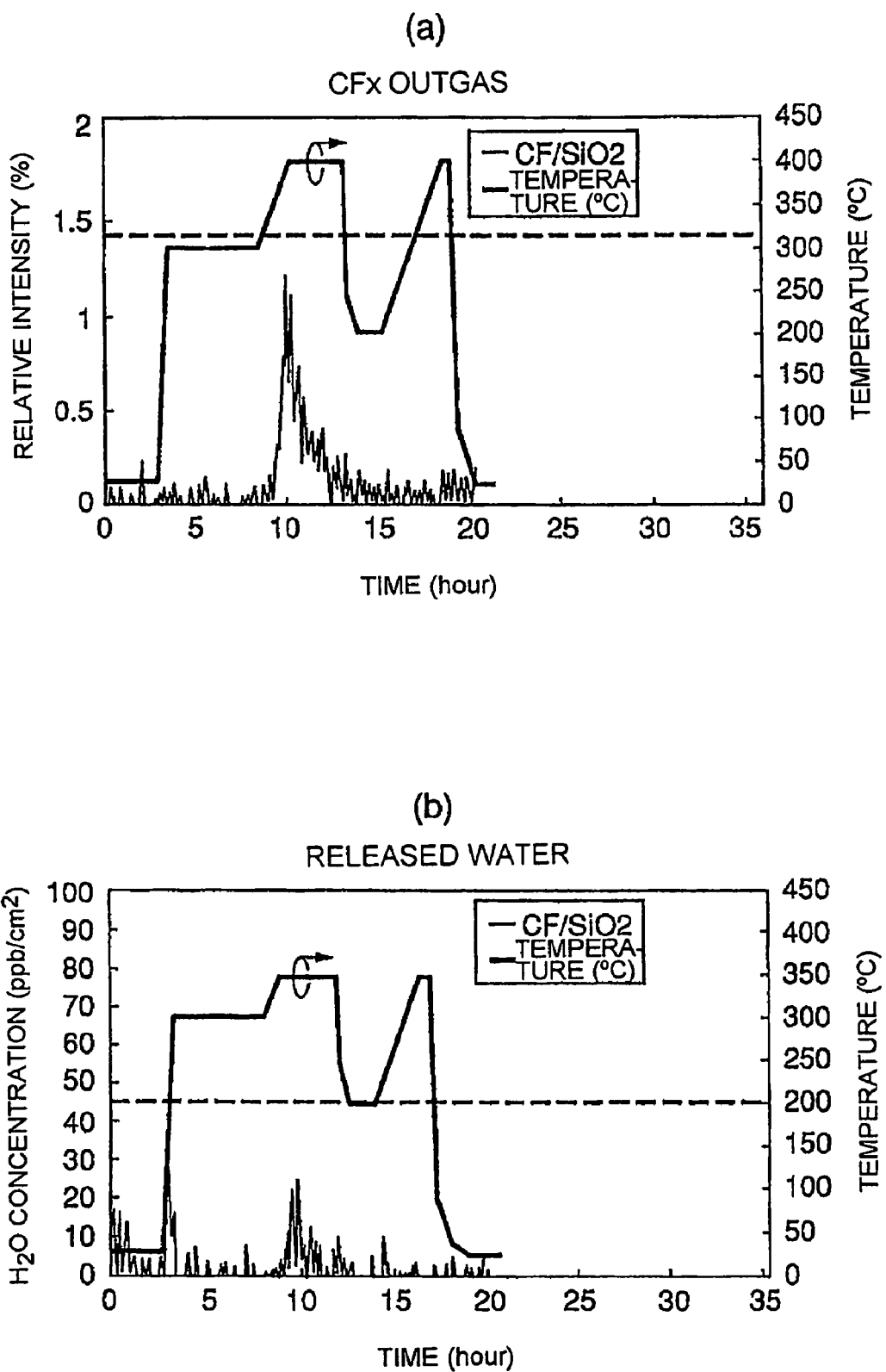
FIG. 18 represents diagrams showing the temperature dependence of CFx-based outgas amount in the case where $C_5F_8$ is introduced in Ar-plasma treatment, then the introduction is stopped in the plasma treatment, and then the Ar-plasma treatment is stopped, wherein (a) shows the relationship between the relative intensity of CFx outgas and the time and (b) shows the relationship between the $H_2O$ concentration (ppb/cm$^2$) for released water and the time.

FIG. 18 represents diagrams showing the temperature dependence of CFx-based outgas amount in the case where $C_5F_8$ is introduced in Ar-plasma treatment, then the introduction is stopped in the plasma treatment, and then the Ar-plasma treatment is stopped, wherein (a) shows the relationship between the relative intensity of CFx outgas and the time and (b) shows the relationship between the $H_2O$ concentration (ppb/cm²) for released water and the time. As shown in FIG. 18(a) and FIG. 18(b), it is seen that dangling components are reduced by causing the material gas to flow in the plasma treatment. Further, it is seen that the released water is also reduced and thus the effective surface area is reduced.

The outgas characteristics of this CFx film were investigated by annealing it after the formation thereof.

Figure 19:
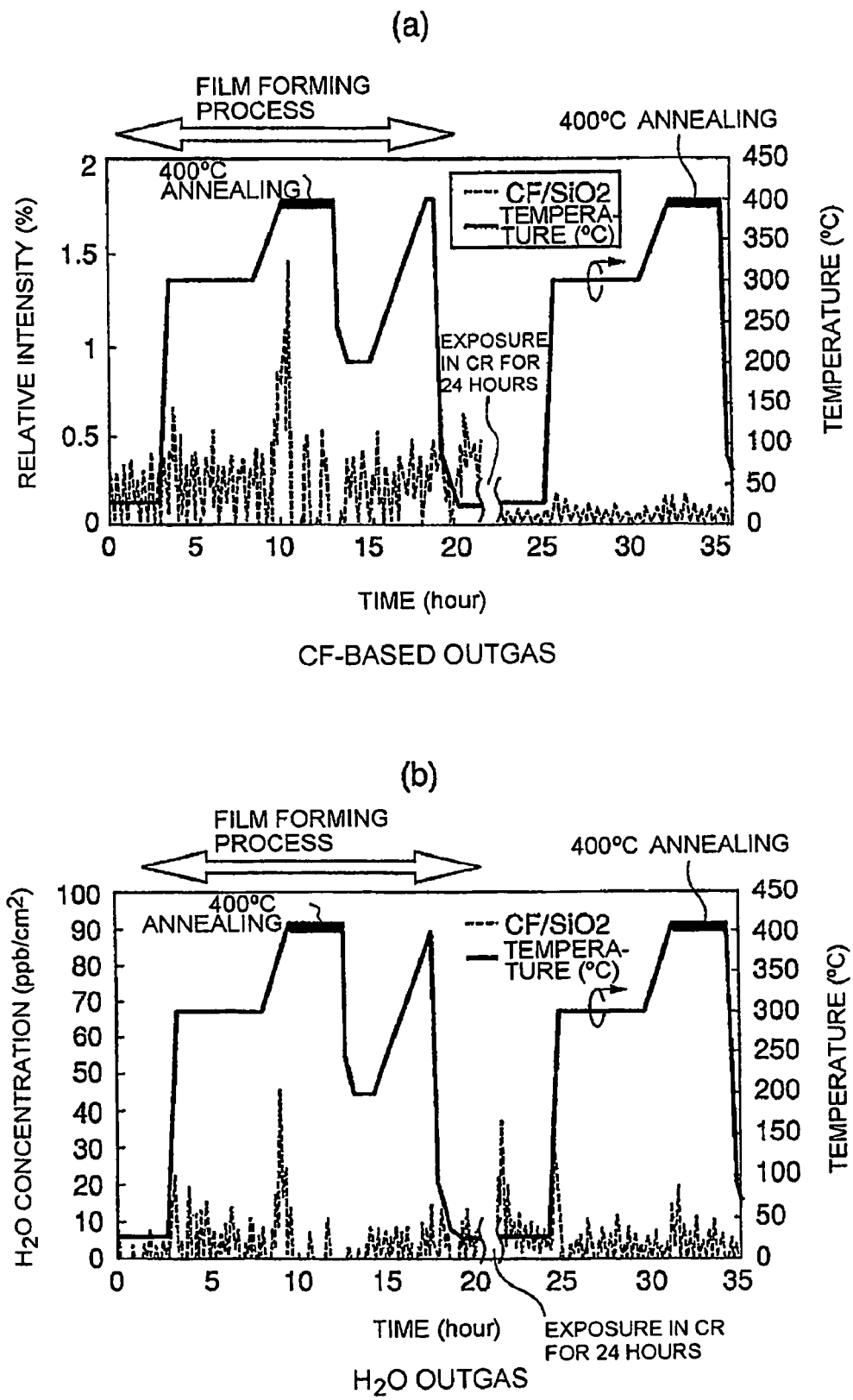
FIG. 19 represents diagrams showing the annealing temperature dependence of outgas amounts of a CFx film, wherein (a) shows the outgas amount of a CF-based gas and (b) shows the outgas amount of an $H_2O$ gas.

FIG. 19 represents diagrams showing the annealing temperature dependence of outgas amounts of the CFx film, wherein (a) shows the outgas amount of a CF-based gas and (b) shows the outgas amount of an $H_2O$ gas. From FIGS. 19(a) and (b), it is seen that, by removing insufficiently bonded components through annealing at 400° C., subsequent decomposition reaction processes do not occur. Further, it is seen that, once heated, there is no generation of water in an in-situ process, and thus it is seen that the in-situ process is essential for the annealing.

Figure 20:
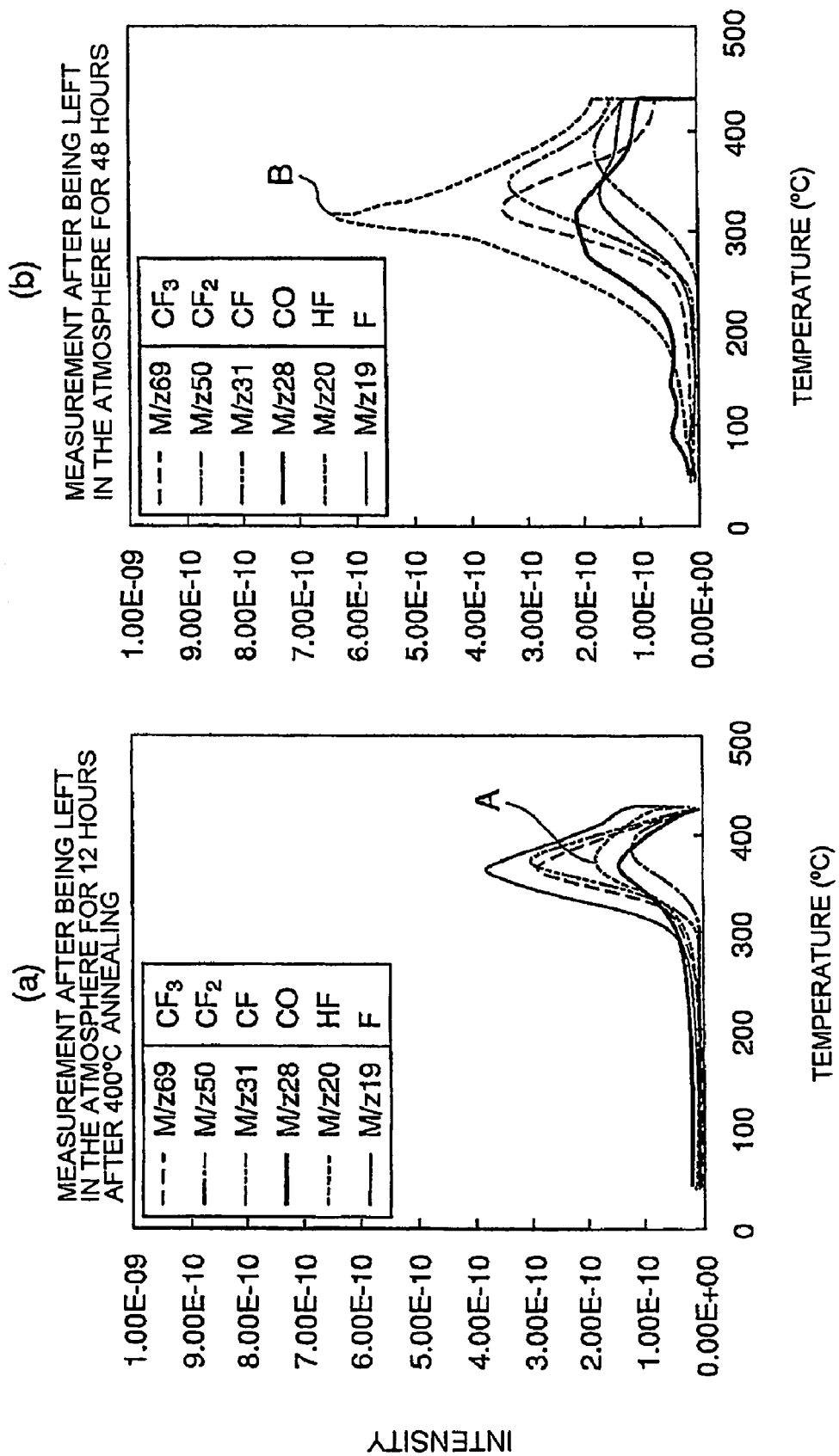
FIG. 20 represents diagrams showing the spectral of various outgases according to a difference in leaving time of a CFx film, wherein (a) shows the results of measurement after being left standing in the atmosphere for 12 hours after annealing at 400° C. and (b) shows the results of measurement after being left standing in the atmosphere for 48 hours without annealing.

FIG. 20 represents diagrams showing the spectral of various outgases according to a difference in leaving time of a CFx film, wherein (a) shows the results of measurement after being left standing in the atmosphere for 12 hours after annealing at 400° C. and (b) shows the results of measurement after being left standing in the atmosphere for 48 hours without annealing. From a comparison between FIG. 20(a) and (b), an HF outgas increases due to being left standing in the atmosphere. This represents that water in the atmosphere and the CFx film reacted with each other.

Figure 21:
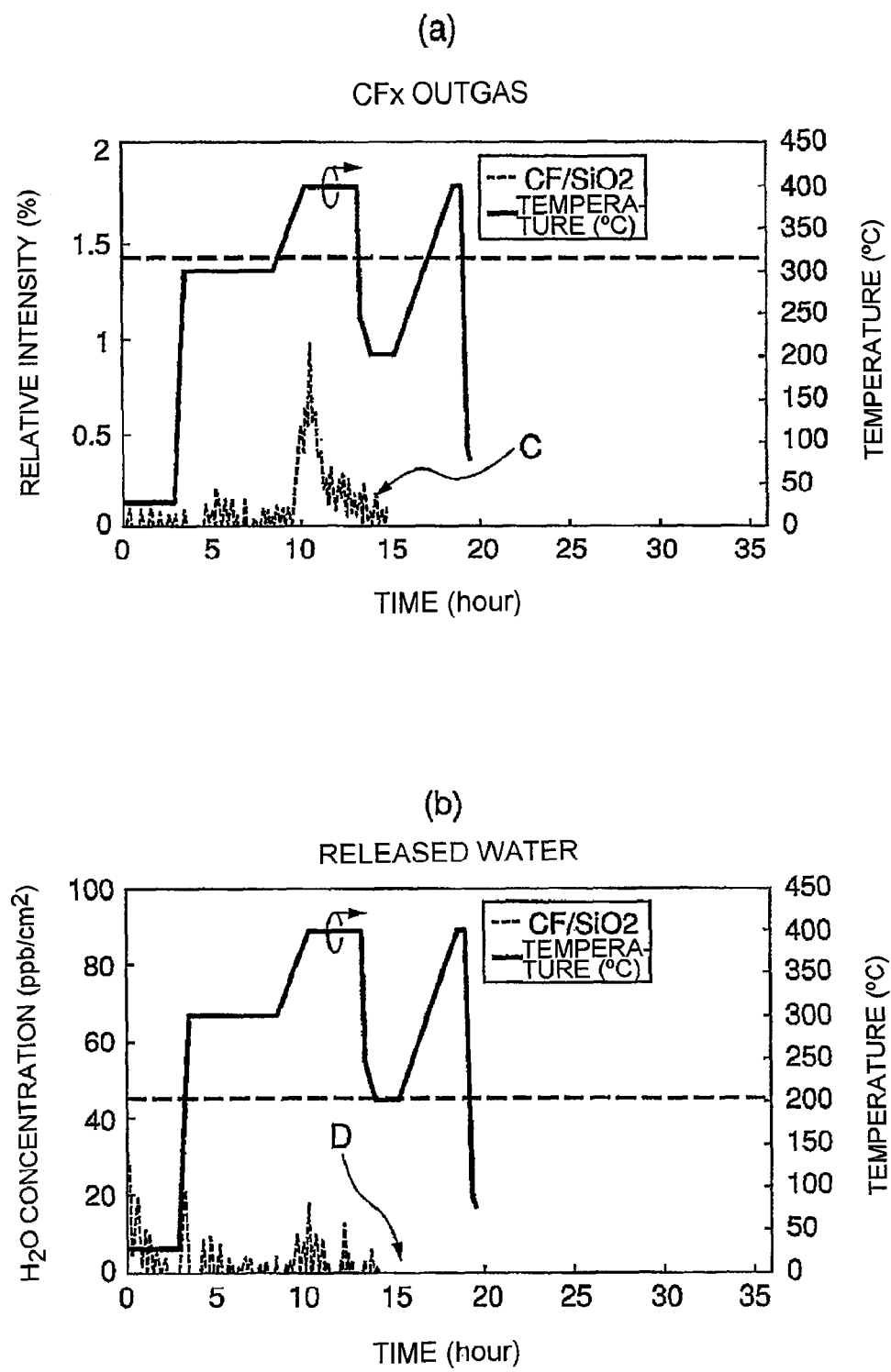
FIG. 21 represents diagrams showing the temperature dependence of Si-based outgas amount, wherein (a) shows the temperature dependence of CFx outgassing and (b) shows the temperature dependence of water release.

FIG. 21 represents diagrams showing the temperature dependence of Si-based outgas amount, wherein (a) shows the temperature dependence of CFx outgassing and (b) shows the temperature dependence of water release. Referring to FIG. 21(a) and FIG. 21(b), an Ar plasma was irradiated for 5 seconds after the treatment, and then annealing was carried out. By the Ar plasma irradiation before the annealing, the CFx outgassing is reduced to ⅔ so that insufficiently bonded CFx is reduced. Further, as shown in FIG. 21(b), the water release is also reduced to ½ and thus the effective surface area is reduced.

Further, after annealing a CFx film at 400° C., an Ar/$N_2$ plasma was irradiated for 5 seconds to nitride the surface.

Figure 22:
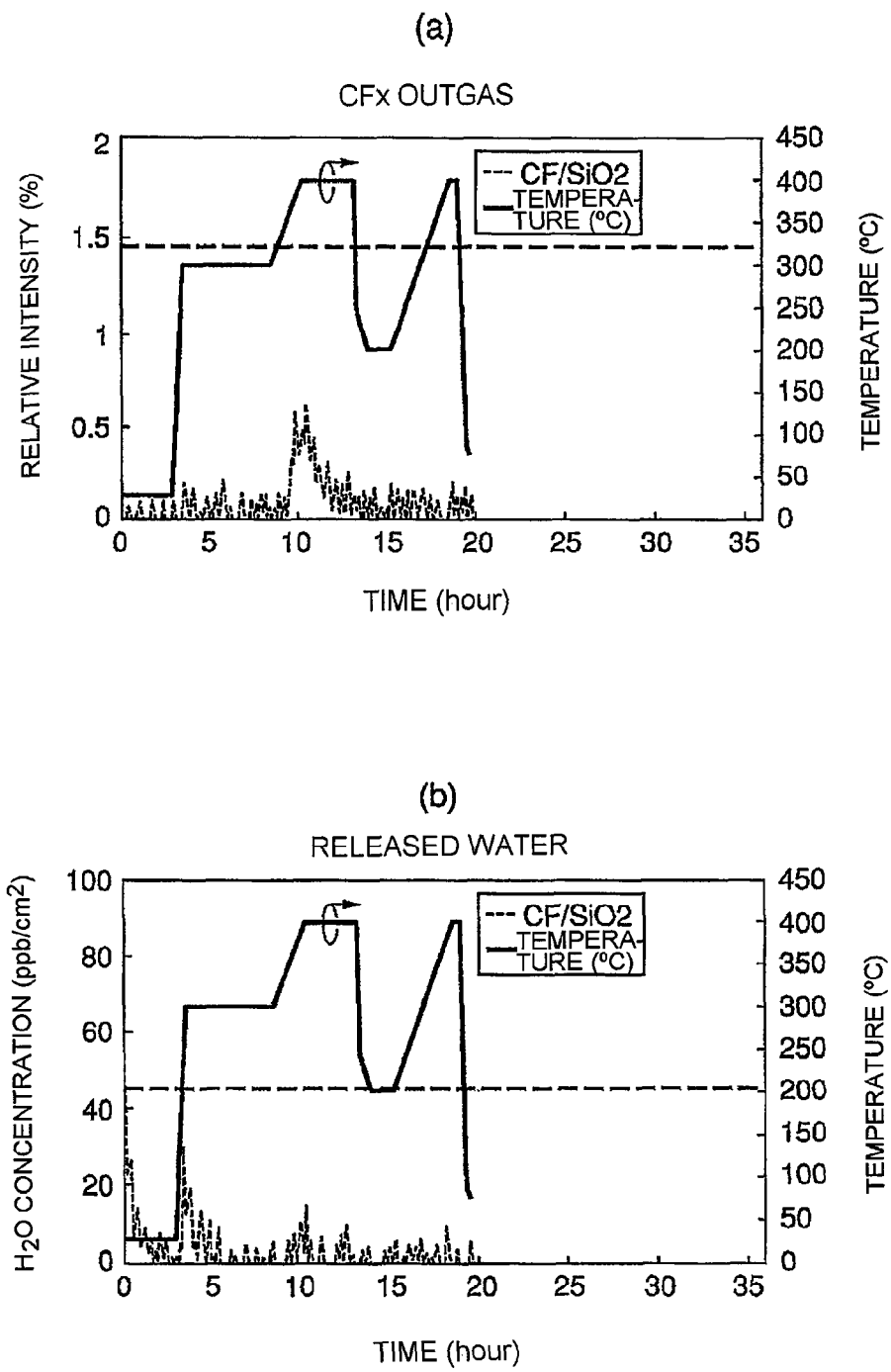
FIG. 22 represents diagrams showing the surface nitriding effects, wherein (a) and (b) show the CFx outgassing effect and the water release effect, respectively, when an Ar/$N_2$ plasma was irradiated for 5 seconds after annealing.

FIG. 22 represents diagrams showing the surface nitriding effects, wherein (a) and (b) show the CFx outgassing effect and the water release effect, respectively, when the Ar/$N_2$ plasma was irradiated for 5 seconds after the annealing. Referring to FIG. 22(a) and FIG. 22(b), it is seen that the CFx gas is reduced to ⅓ as compared with the standard condition by the Ar/$N_2$ plasma irradiation after the annealing. Further, it is seen that the released water is also reduced to ⅓ and thus the effective surface area is reduced.

Figure 23:
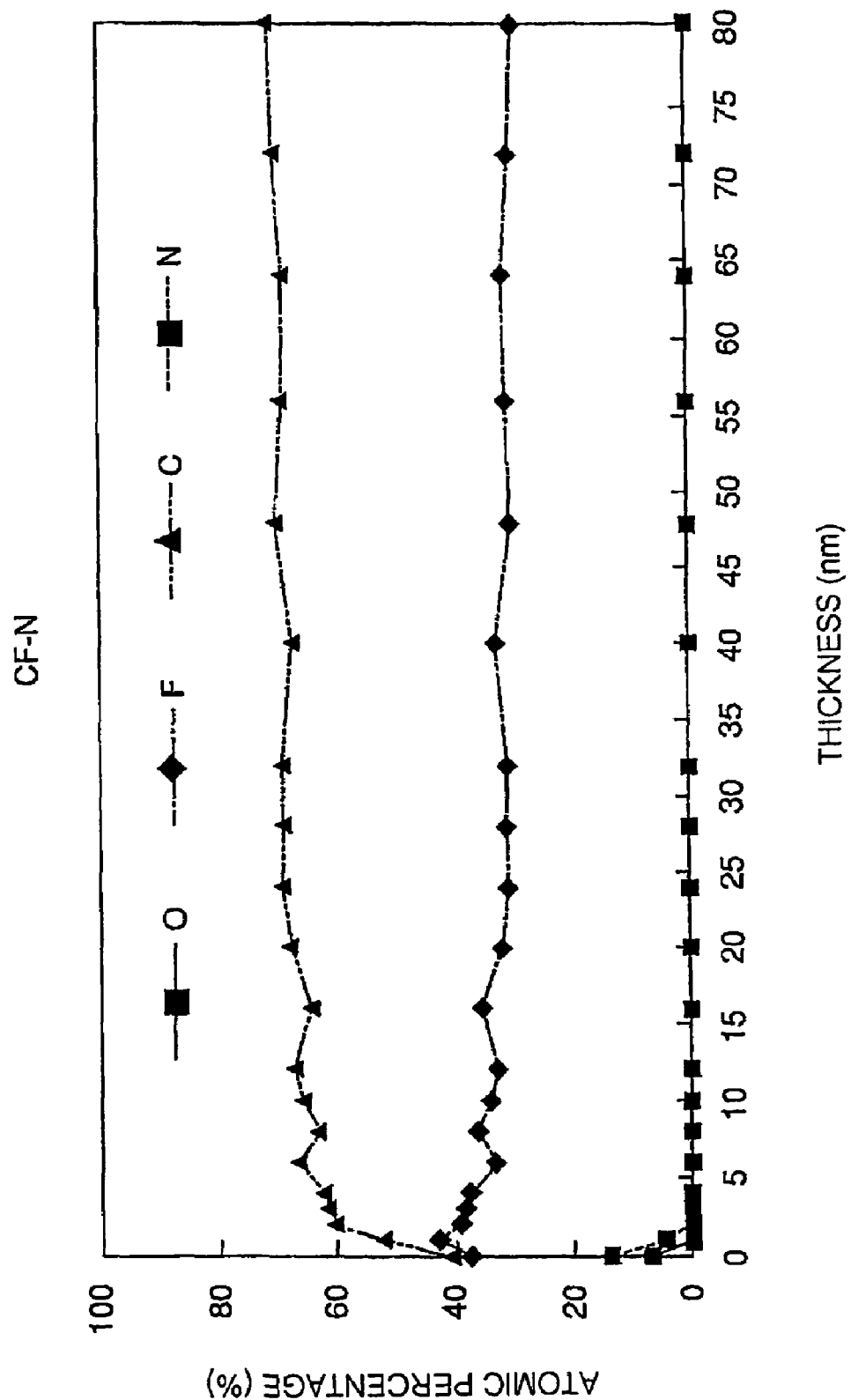
FIG. 23 shows the results of measurement of a sample formed with a CFx film and subjected to Ar/$N_2$ plasma irradiation after annealing like in FIG. 17, using an X-ray photoelectron spectrometer (ESCA: Electron Spectroscopy for Chemical Analysis).

FIG. 23 shows the results of measurement of a sample formed with a CFx film and subjected to Ar/$N_2$ plasma irradiation after annealing like in FIG. 17, using an X-ray photoelectron spectrometer (ESCA: Electron Spectroscopy for Chemical Analysis). From the results of FIG. 23, it has been found that N atoms were detected only in several nm from the surface and thus the outgassing was reduced by the surface quality improvement by the annealing. The permittivity of the CFx film was 2.04 before the outgassing while it was 2.08 after the outgassing, and thus no large change was observed.

Figure 24:
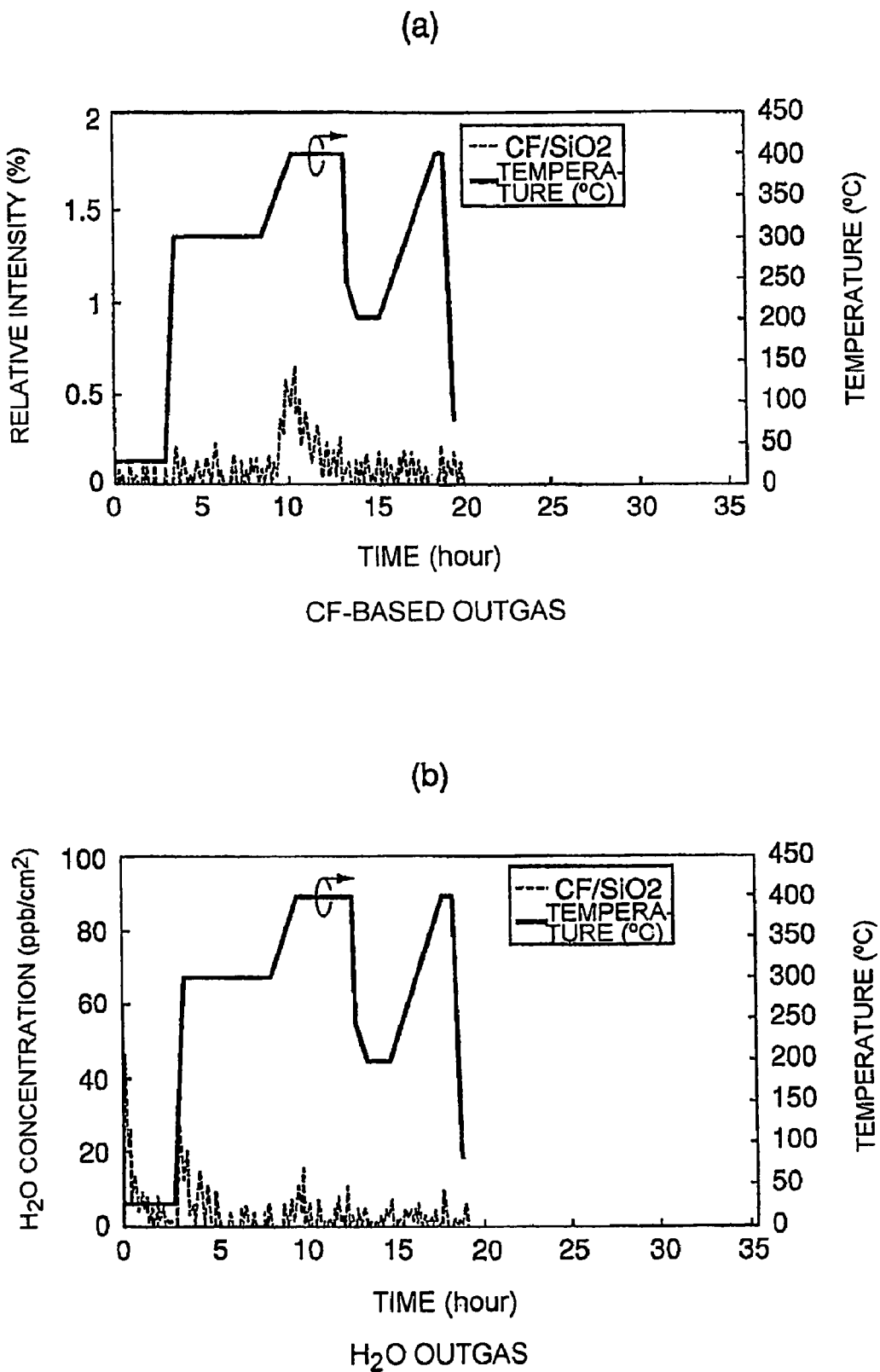
FIG. 24 represents diagrams showing the film forming condition dependence of outgas amounts of a CFx film, wherein (a) shows CF-based outgassing and (b) shows $H_2O$-based outgassing.

FIG. 24 represents diagrams showing the film forming condition dependence of outgas amounts of a CFx film, wherein (a) shows CF-based outgassing and (b) shows $H_2O$-based outgassing. As shown in FIG. 24, it is seen that the CFx outgassing is reduced by Ar/N plasma irradiation for 5 seconds after annealing at 400° C. to thereby Ar/N₂-treat the surface (surface nitriding). It is seen that the CFx outgassing is reduced to ⅓ as compared with no annealing.

Figure 25:
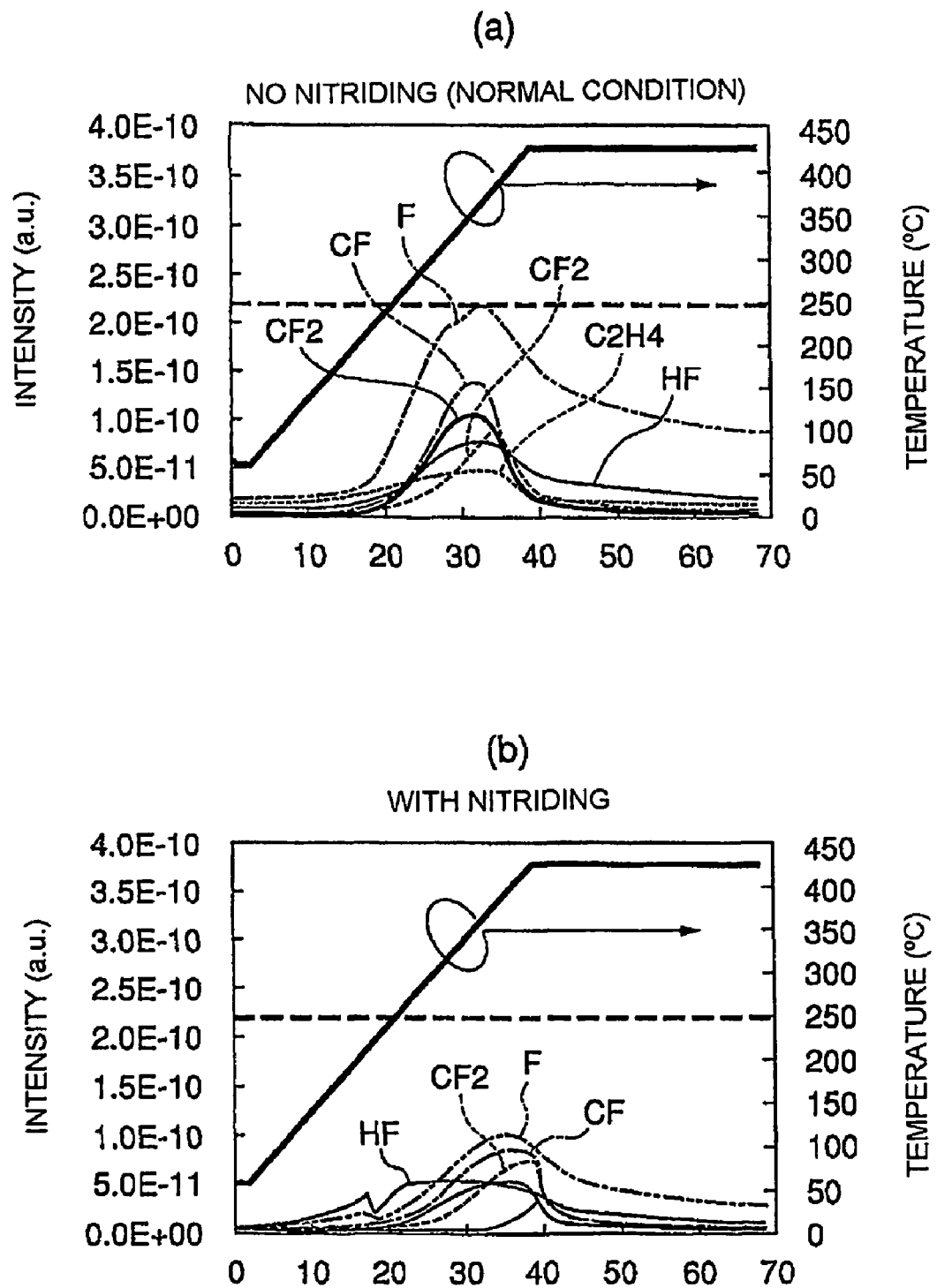
FIG. 25 represents diagrams showing the results of outgassing in the case of Ar/$N_2$ plasma treatment after annealing a CFx film formed to 400 nm, wherein (a) shows the results with no nitriding being the normal condition and (b) shows the results with nitriding. It is seen that outgassing is small in amount by the Ar/$N_2$ nitriding treatment.

FIG. 25 represents diagrams showing the results of outgassing in the case of Ar/N₂ plasma treatment after annealing a CFx film formed to 400 nm, wherein (a) shows the results with no nitriding being the normal condition and (b) shows the results with nitriding. It is seen that the outgassing is small in amount by the Ar/N₂ nitriding treatment.

Figure 26:
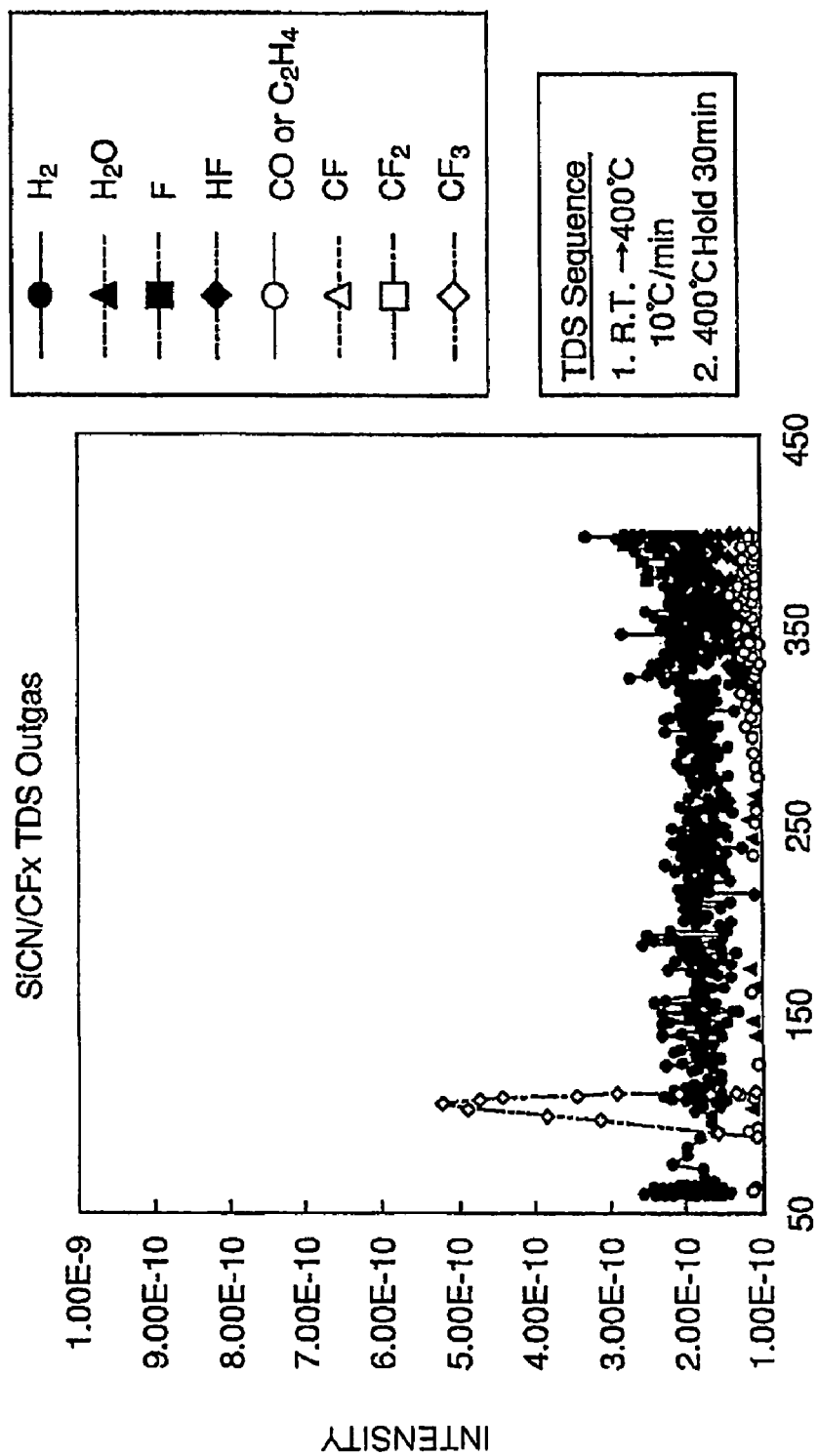
FIG. 26 is a diagram showing the outgas TDS spectra of an SiCN film in-situ formed on a CFx film (SiCN/CFx) formed on a Si underlayer.

FIG. 26 is a diagram showing the outgas TDS spectra of an SiCN film in-situ formed on a CFx film (SiCN/CFx) formed on a Si underlayer. As shown in FIG. 26, it is seen that outgassing is reduced by forming the SiCN film as a cap layer on the CFx film.

Next, the surface quality improvement achieved by annealing and subsequent nitriding treatment will be described using FIGS. 27 to 31.

Figure 27:
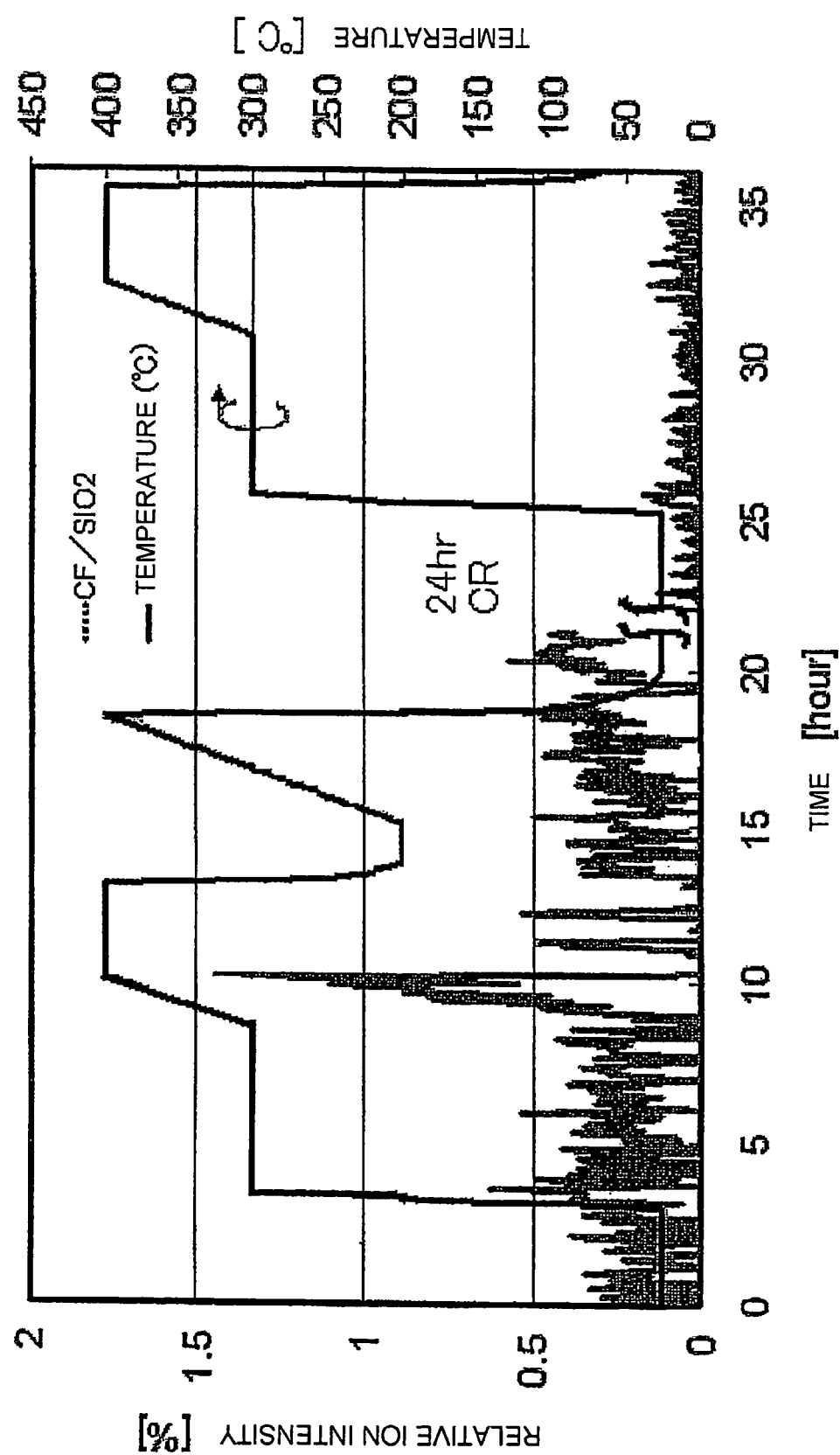
FIG. 27 is a diagram showing the temperature dependence of CF-based outgas amount when a CFx film formed at 200° C. is annealed at 350° C.

FIG. 27 shows the temperature dependence of CF-based outgas amount when a CFx film is formed on SiO₂ at 200° C. and annealed in Ar at 350° C. for 30 minutes. Referring to FIG. 27, it is observed that, by removing insufficiently bonded components through annealing, decomposition reactions do not occur even if the temperature is raised to 400° C. thereafter, and the outgas amount of CF-based gas is reduced.

Figure 28:
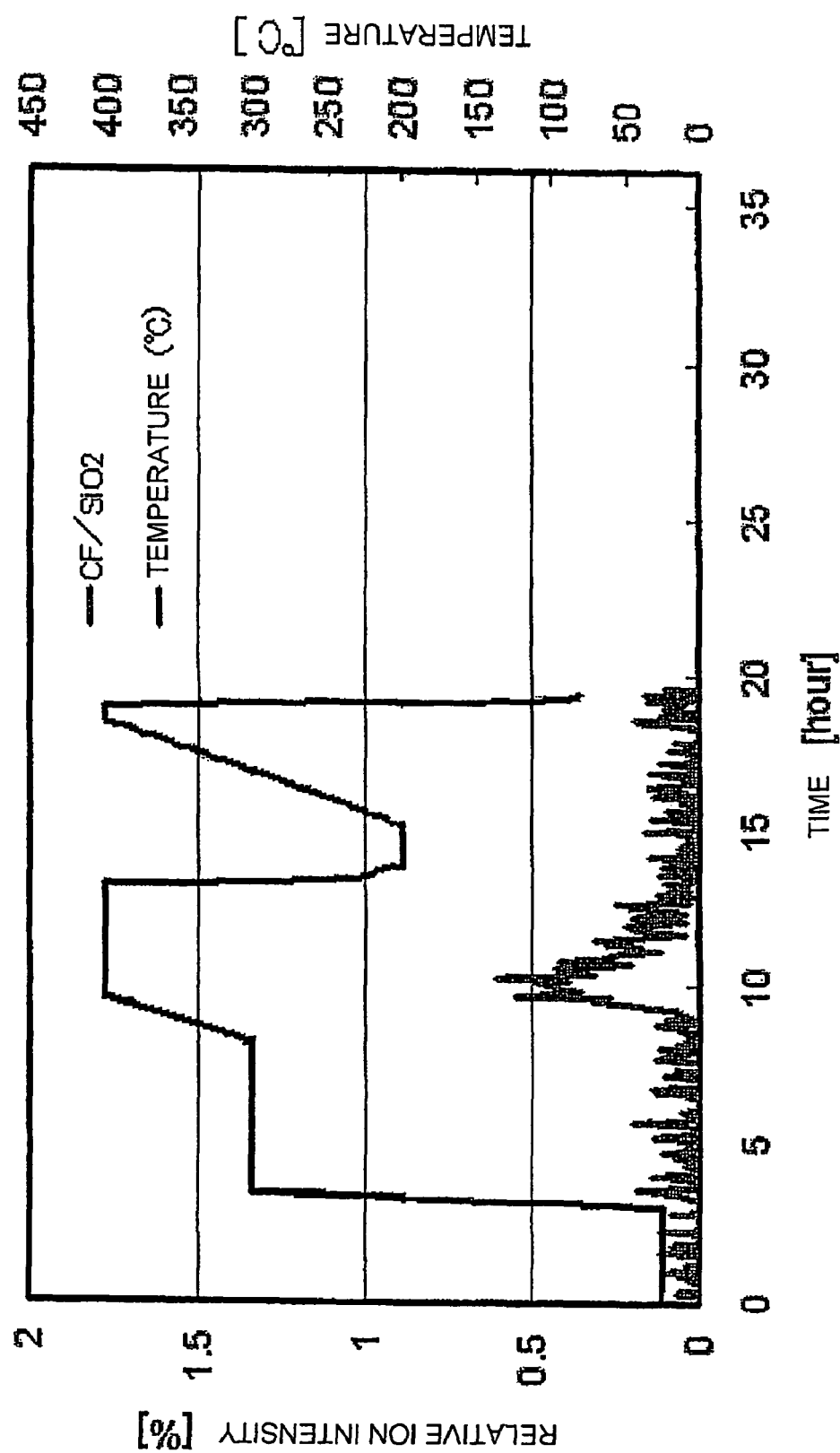
FIG. 28 is a diagram showing the temperature dependence of outgas amount in the case where a film is formed at 200° C. and then annealed at 350° C. and, further, the surface thereof is nitrided by an Ar/$N_2$ plasma at 200° C.

FIG. 28 is a diagram showing the temperature dependence of outgas amount in the case where nitriding treatment is performed by an Ar/N₂ plasma at 200° C. after film formation at 200° C. and annealing at 350° C. As shown in FIG. 28, it has been found that when a CFx film is formed on SiO₂, then annealed at 350° C., and then irradiated with an Ar/N₂ plasma at 200° C., the outgassing is extremely reduced and thus the film surface quality improvement effect is large.

Figure 29:
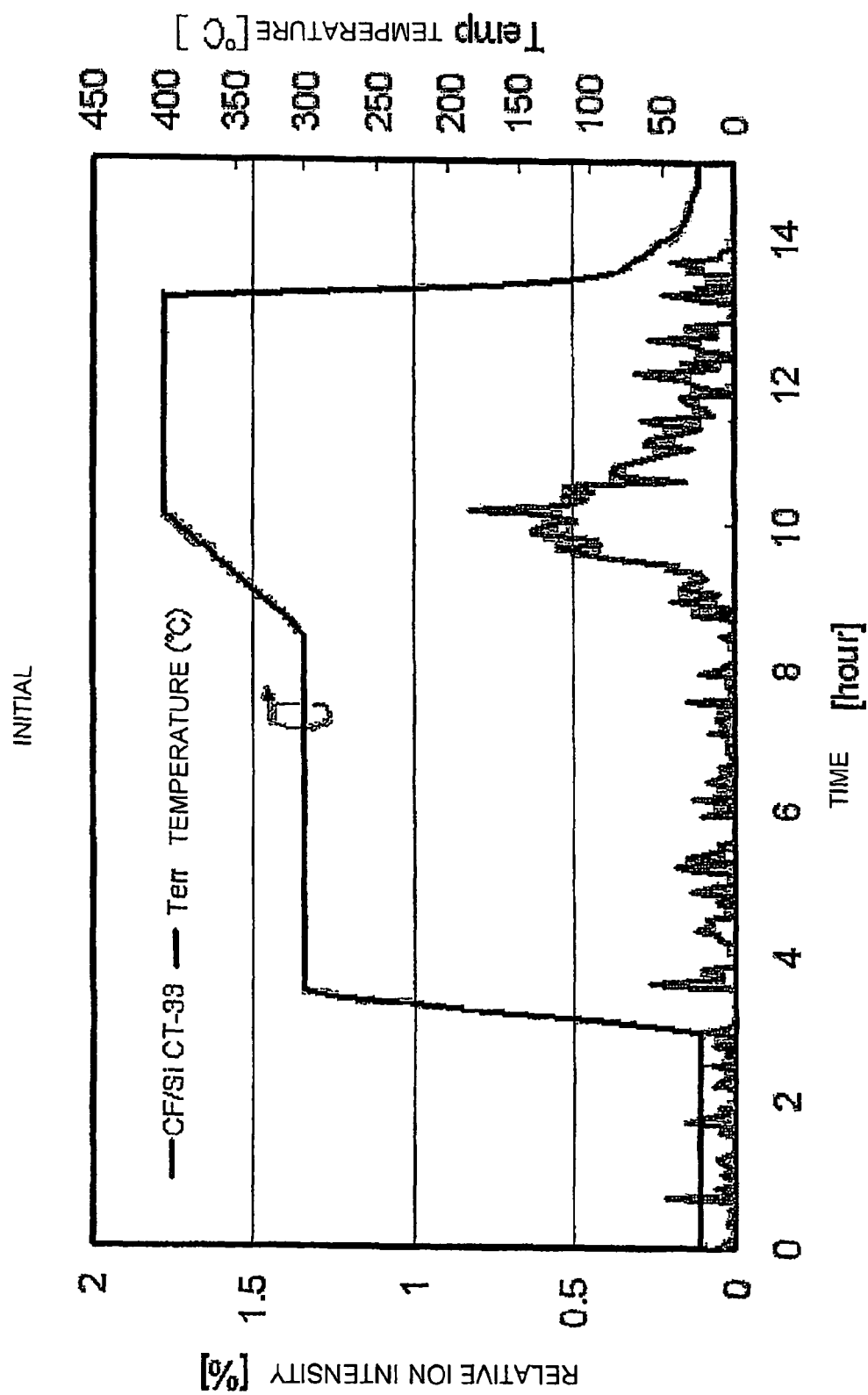
FIG. 29 is a diagram showing the outgas amount in the case where a CFx film is formed on a Si substrate at 350° C. and no annealing is carried out.

FIG. 29 is a diagram showing the outgas amount in the case where a CFx film is formed on a Si substrate at 350° C. and no annealing is carried out.

Figure 30:
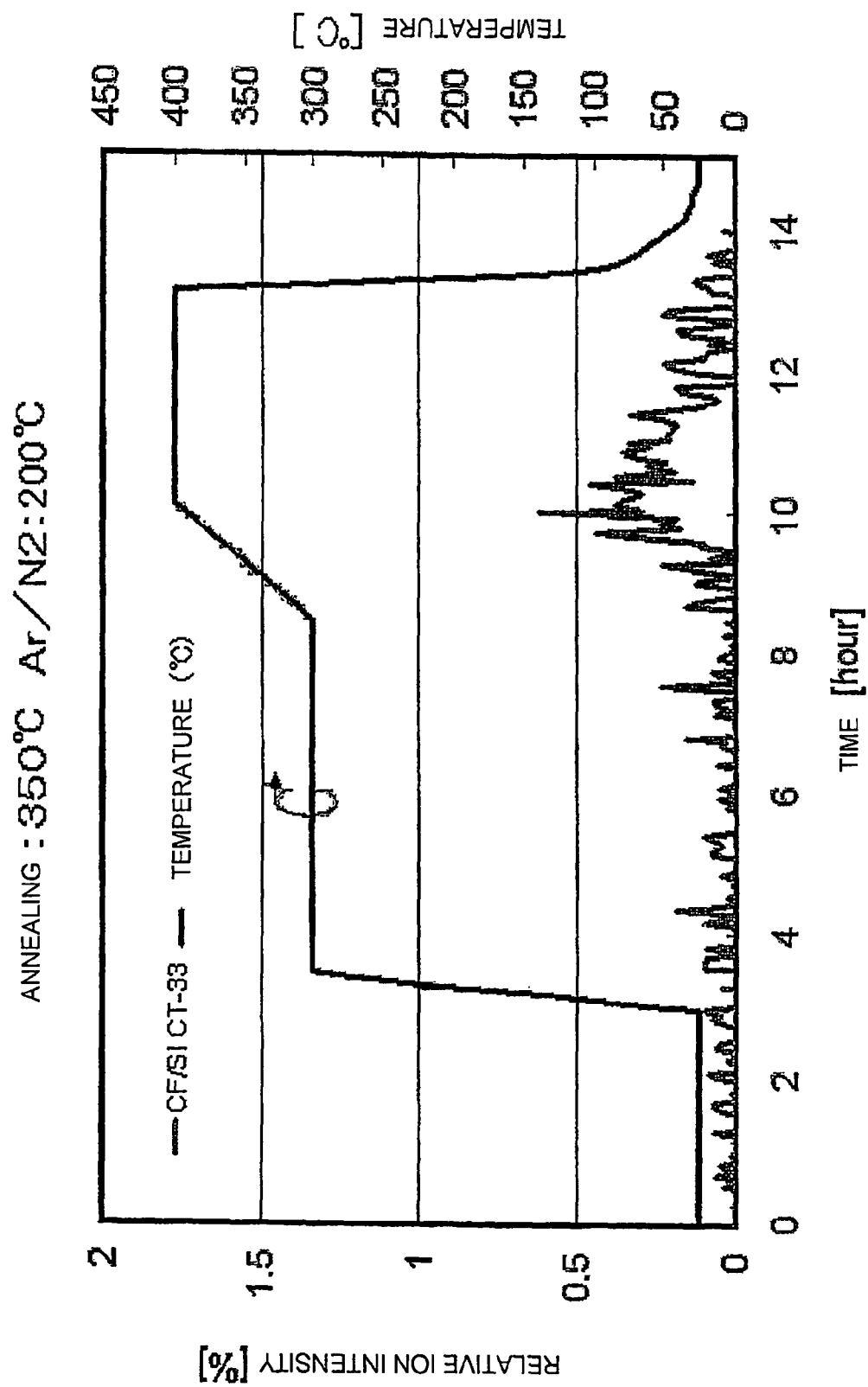
FIG. 30 is a diagram showing the outgas amount in the case where a CFx film is formed on a Si substrate at 350° C., then annealed at 350° C., and then the surface thereof is nitrided by an Ar/$N_2$ plasma at 200° C.

FIG. 30 is a diagram showing the outgas amount in the case where a CFx film is formed on a Si substrate at 350° C., then annealed at 350° C., and then the surface thereof is nitrided by an Ar/N₂ plasma at 200° C. As a result of comparing FIG. 30 with FIG. 29, it has been found that the outgassing is suppressed and the surface quality is improved by annealing and then nitriding the surface.

Figure 31:
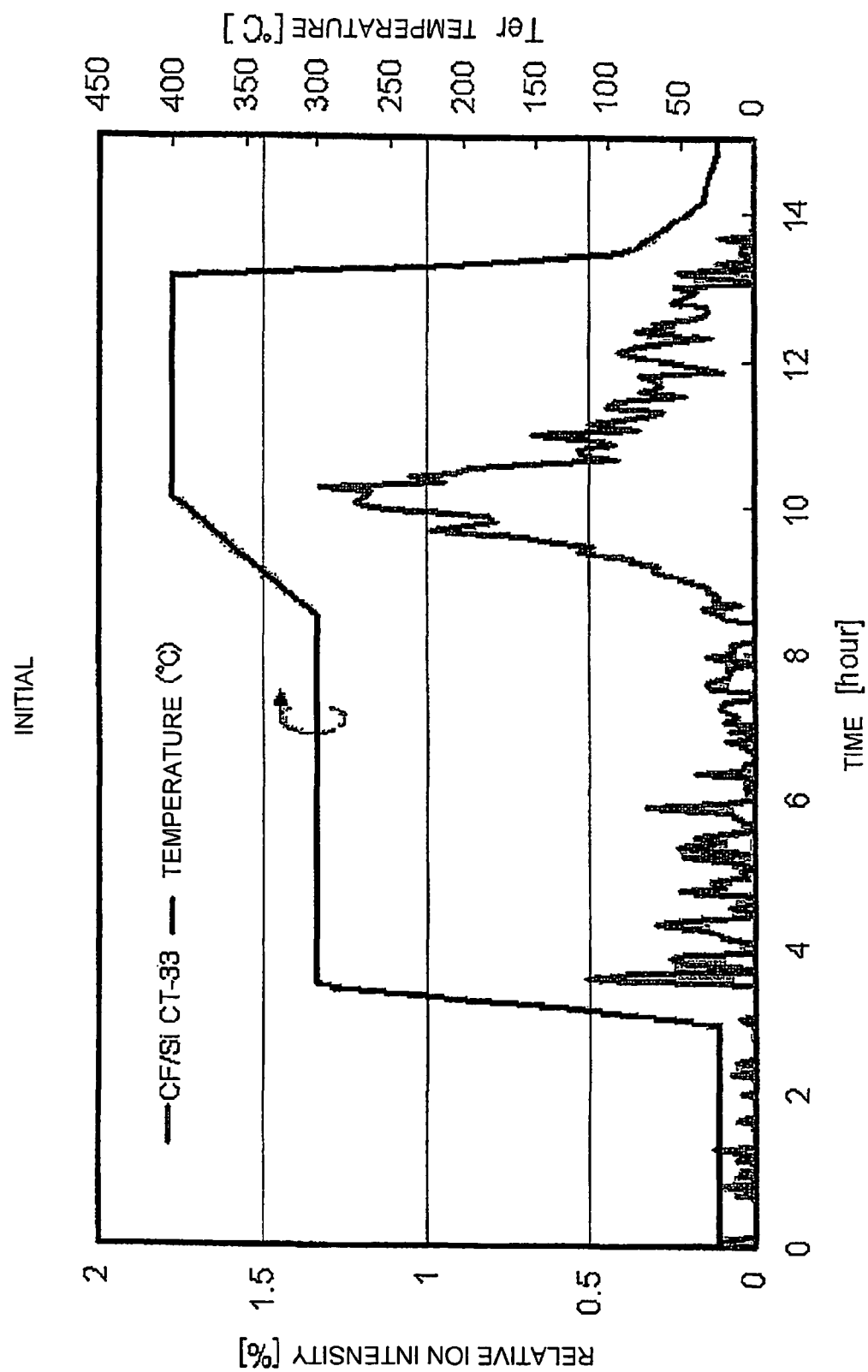
FIG. 31 is a diagram showing the outgas amount in the case where a CFx film is formed on a Si substrate at 400° C. and no annealing is carried out.

FIG. 31 is a diagram showing the outgas amount in the case where a CFx film is formed on a Si substrate at 400° C. and no annealing is carried out. As shown in FIG. 31, the outgassing is observed after forming the CFx film on Si at 400° C. and then annealing it at 350° C.

Figure 32:
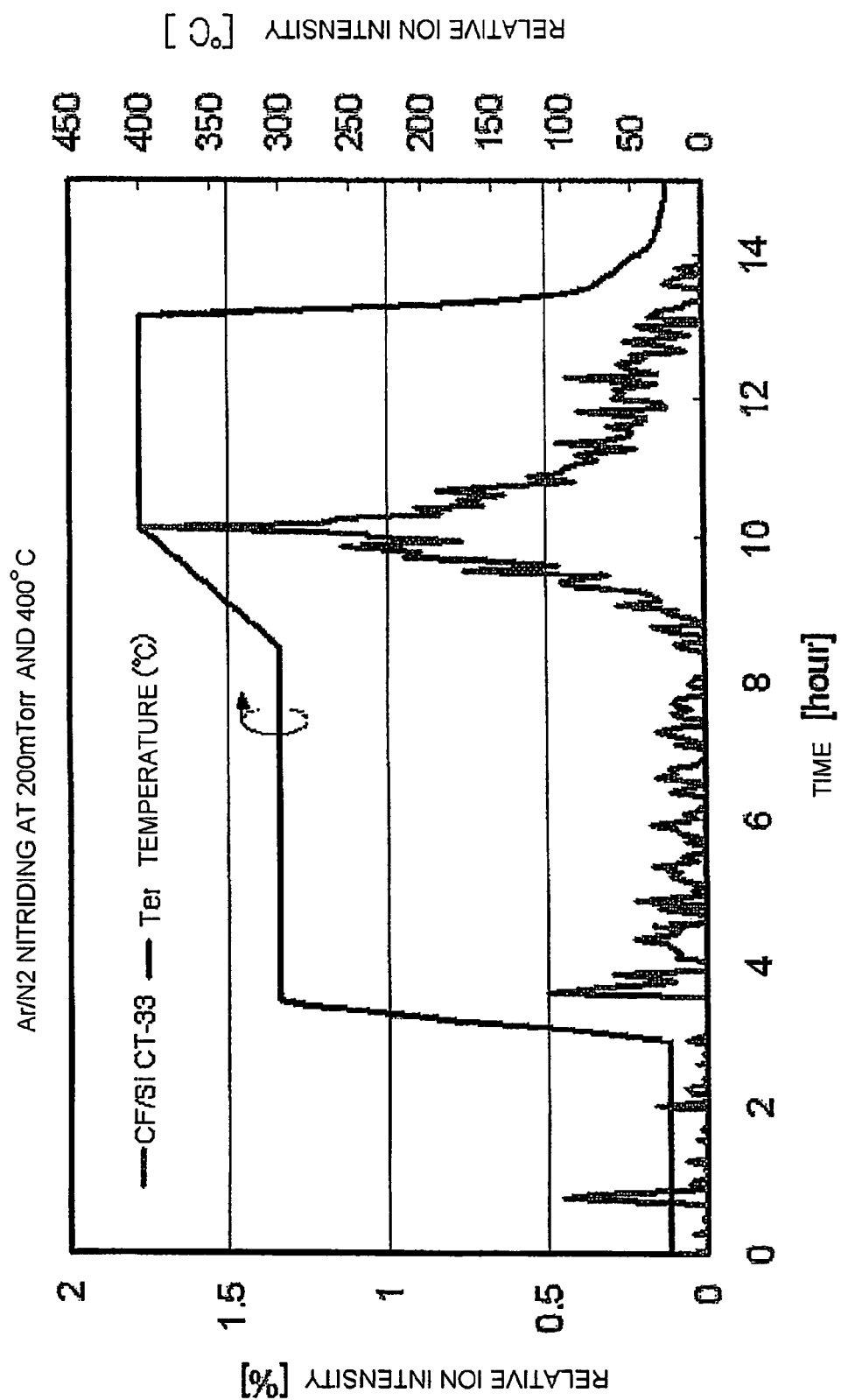
FIG. 32 is a diagram showing the outgas amount in the case where a CFx film is formed on a Si substrate at 400° C. and then the surface thereof is nitrided by an Ar/N$_2$ plasma at 400° C. without annealing.
Figure 33:
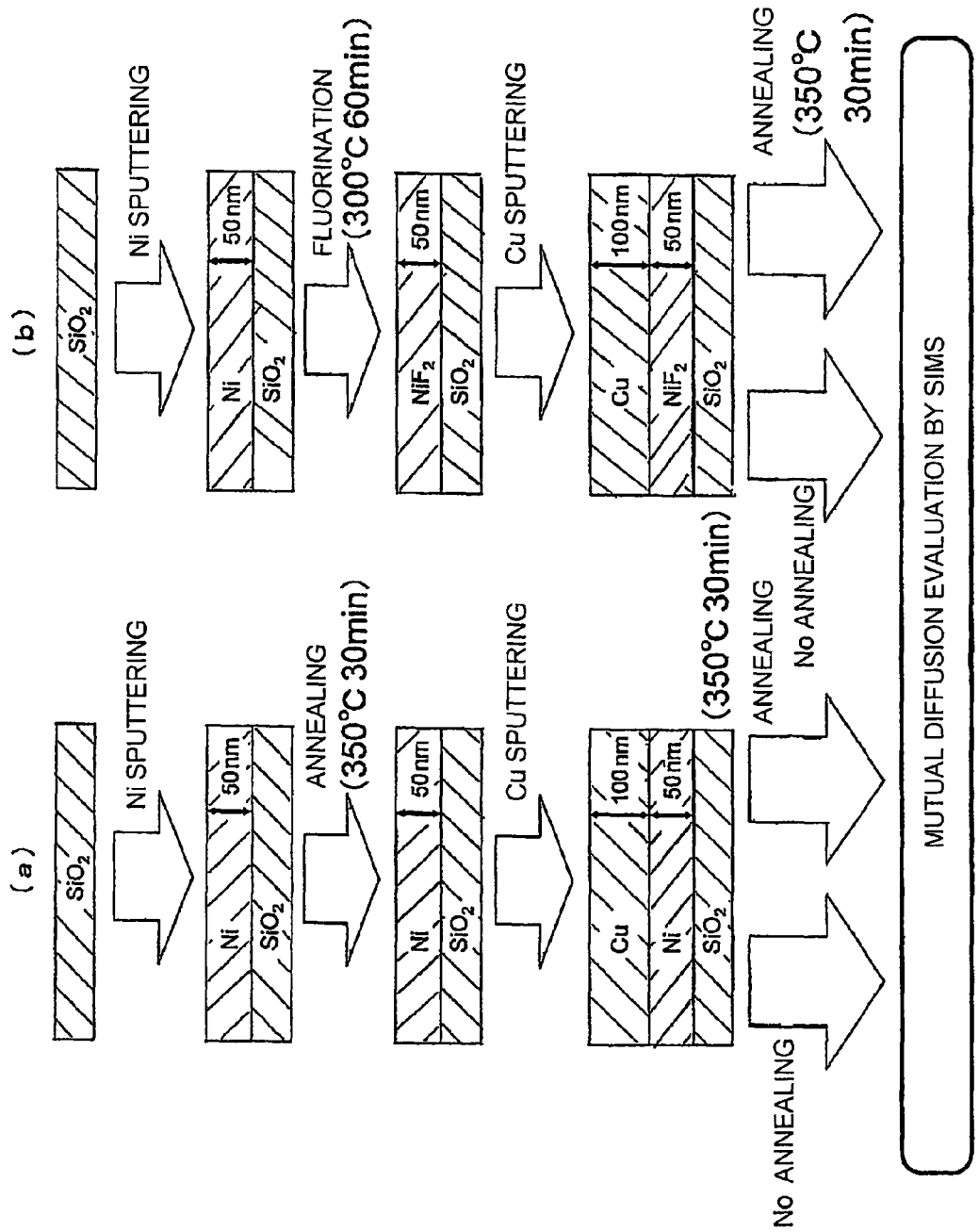
FIGS. 33 (a) and (b) are diagrams showing an NiF$_2$ film forming method and a Ni film forming method for comparison, respectively.
Figure 34:
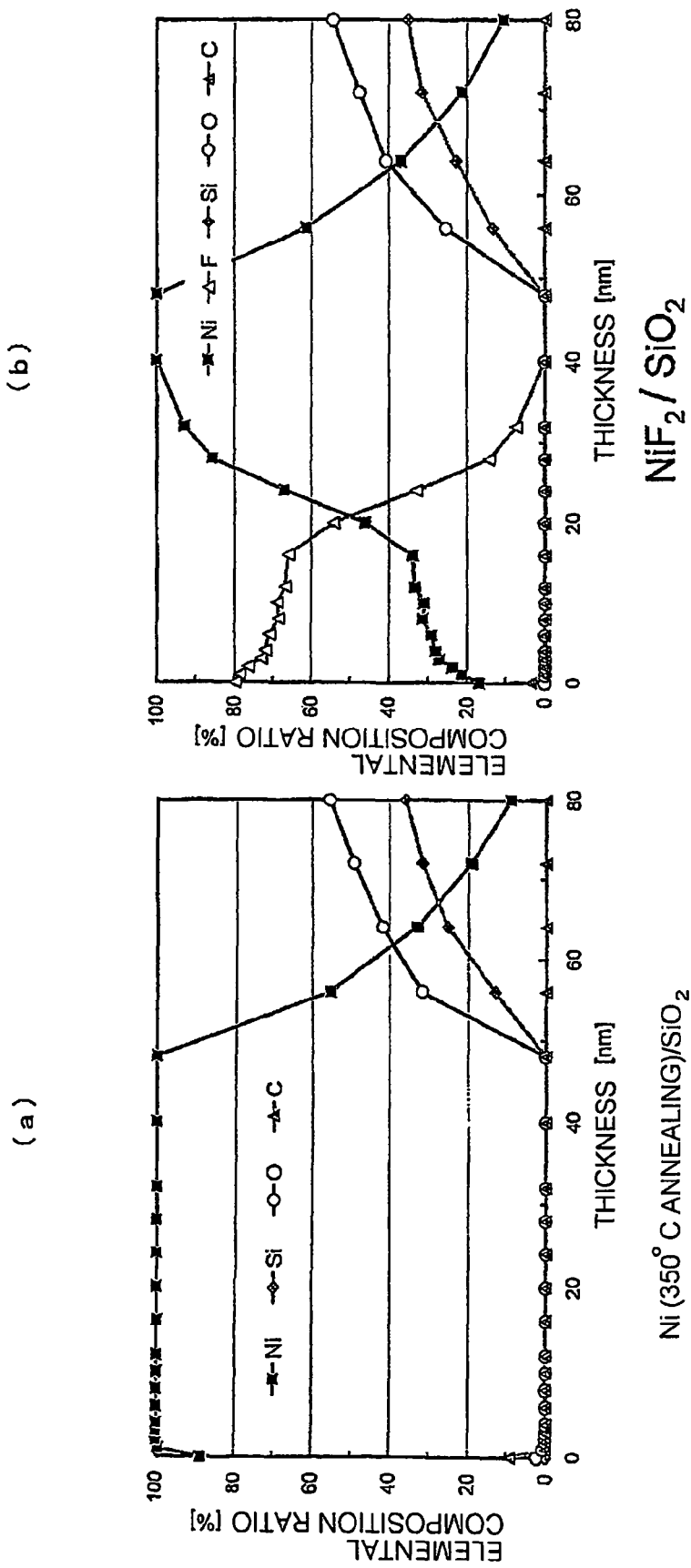
FIGS. 34 (a) and (b) are graphs showing the compositions of a Ni film and an NiF$_2$ film, respectively.
Figure 35:
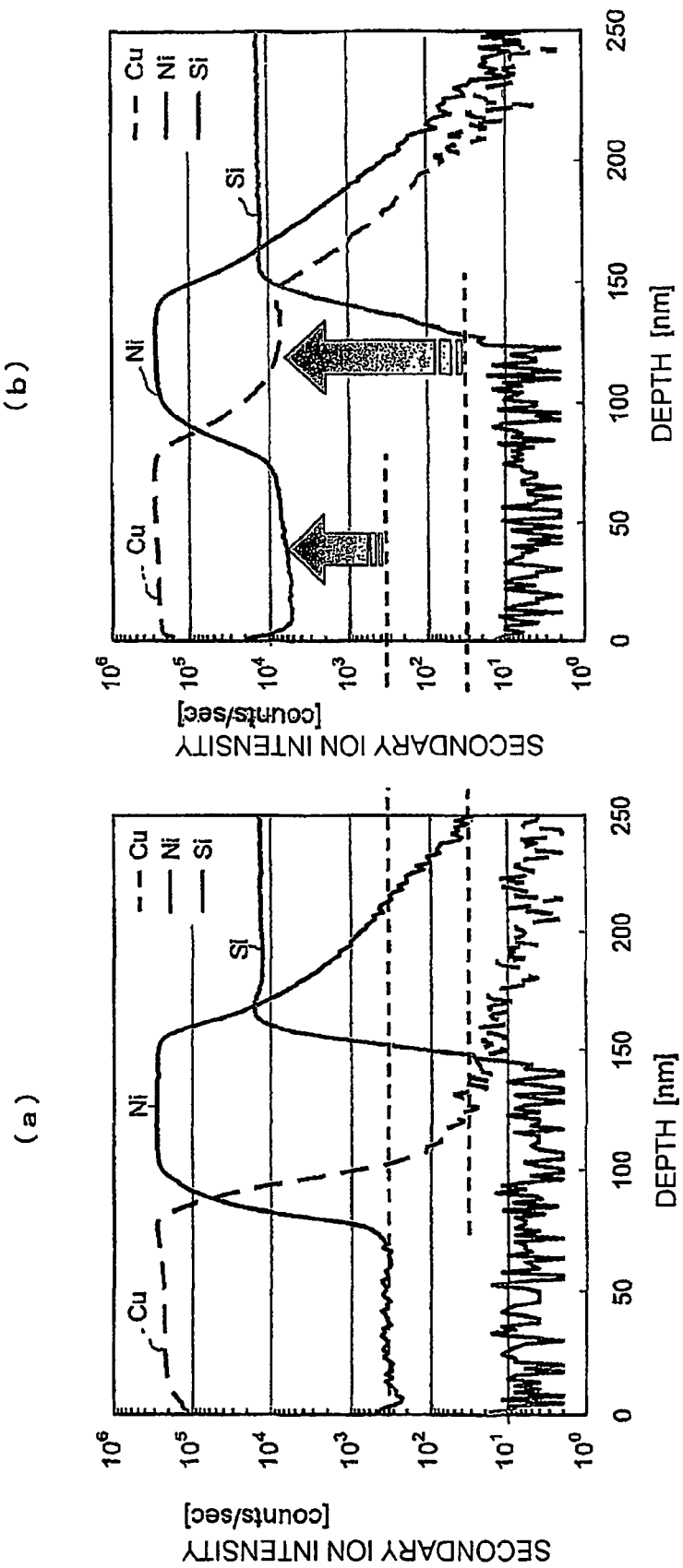
FIGS. 35 (a) and (b) are diagrams showing the states before and after annealing in the case where a Ni film of 50 nm is formed as a barrier metal layer and a Cu film is formed thereon.
Figure 36:
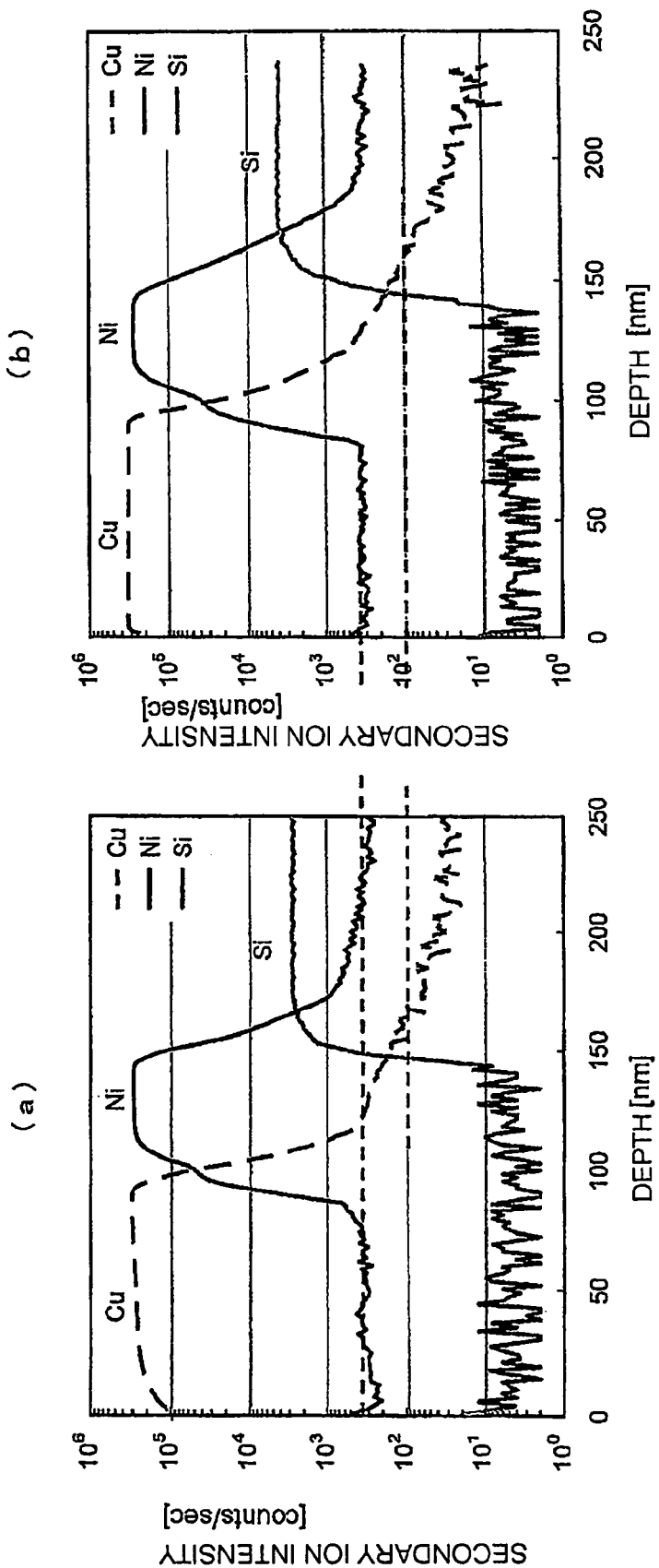
FIGS. 36 (a) and (b) are diagrams showing diffusion of Cu, Ni, and so on before and after annealing when an NiF$_2$ film of 50 nm is formed as a barrier (metal) layer.

FIG. 32 is a diagram showing the outgas amount in the case where a CFx film is formed on a Si substrate at 400° C. and then irradiated with an Ar/N₂ plasma without annealing. As shown in FIG. 32, it is seen that the outgassing increases when the nitriding treatment is performed by the Ar/N₂ plasma at 400° C.

Therefore, from the results of FIGS. 27 to 32, it is seen that the effect of the annealing is large and, by the surface nitriding with the Ar/N₂ plasma at about 200° C., the outgassing decreases and the surface is improved in quality. Further, it has been confirmed that the adhesion increases. Further, it has been found from the results of other experiments that the adhesion increases in the case of nitriding at a high temperature exceeding 200° C. (preferably 300° C. to 400° C.) and that, in the case of plasma treatment using only N₂ with no Ar gas, the adhesion is improved, the surface roughness is small, and the outgas amount is reduced.

Next, referring to FIGS. 33 to 39, a description will be given of the structure and effect of using an NiF₂ film as a barrier layer.

FIGS. 33(a) and (b) are diagrams showing an NiF₂ film forming method and a Ni film forming method for comparison, respectively.

FIGS. 34(a) and (b) are graphs showing the compositions of a Ni film and an NiF₂ film, respectively. FIGS. 34(a) and (b) show that a Ni film (after annealing at 350° C.) and an NiF₂ film are formed on SiO₂, respectively.

FIGS. 35(a) and (b) show the states before and after annealing in the case where a Ni film of 50 nm is formed as a barrier metal layer and a Cu film is formed thereon, wherein it is shown that Ni diffuses into the Cu film and Cu diffuses into the Ni film.

FIGS. 36(a) and (b) show that when an NiF₂ film of 50 nm is formed as a barrier (metal) layer, no diffusion of Cu or Ni occurs before and after annealing and thus, when the NiF₂ film is used as the barrier layer, it completely functions as a barrier to Cu.

Figure 37:
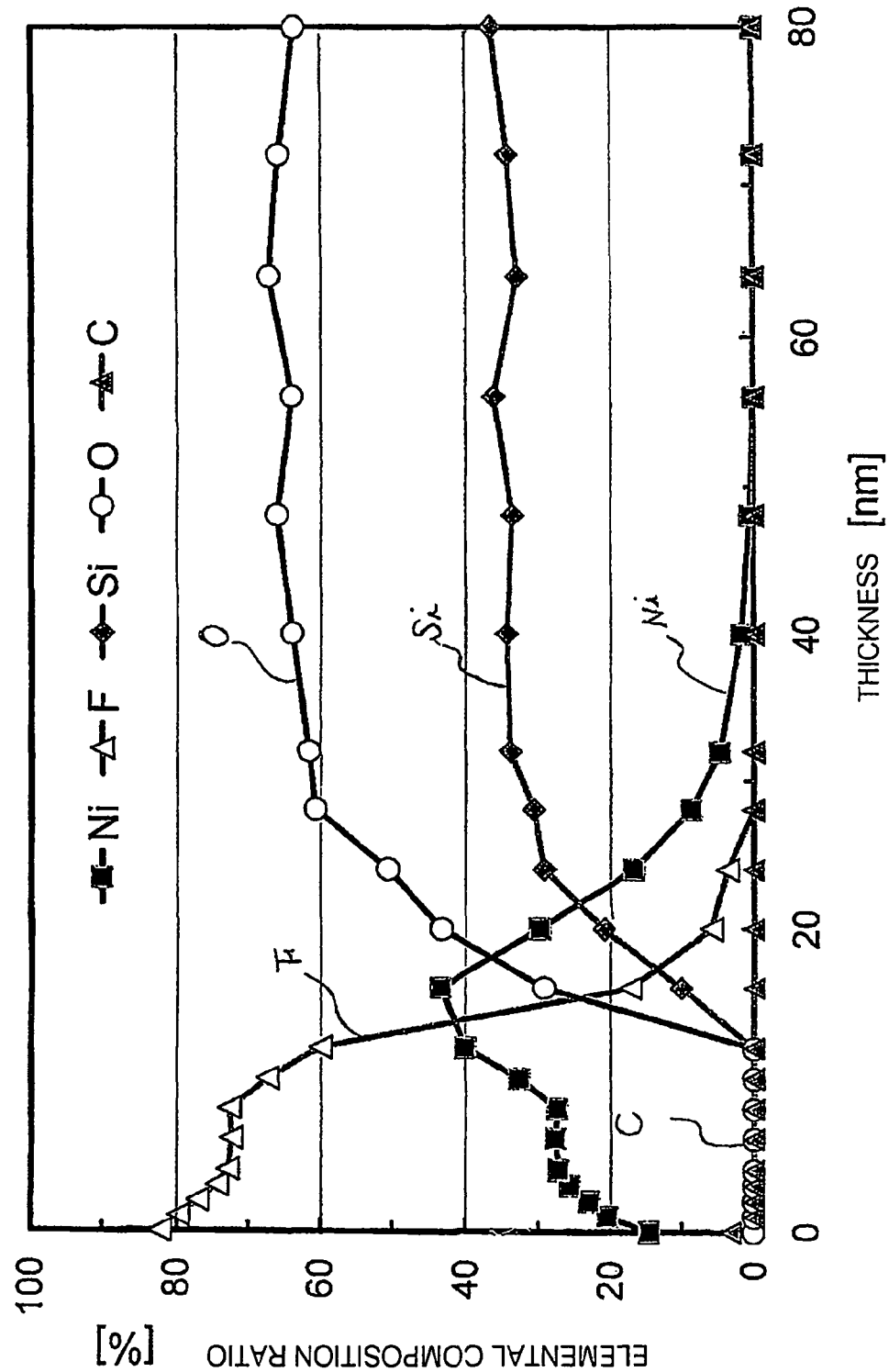
FIG. 37 is a diagram showing the results of elemental analysis in the depth direction after the formation of the NiF$_2$ film.
Figure 38:
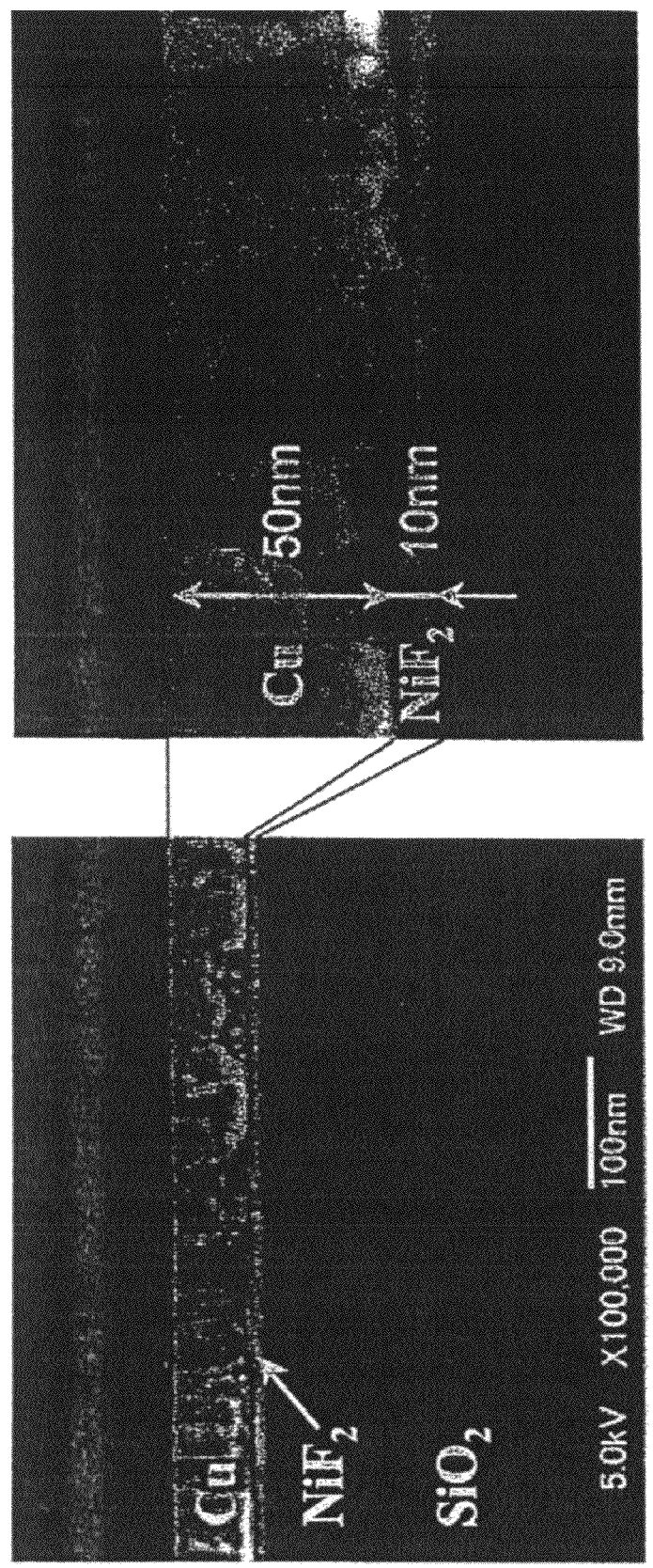
FIG. 38 represents sectional SEM photographs showing a metallographic structure in which a Cu layer is formed on an NiF$_2$ layer, wherein the right photograph enlarges a portion of the left photograph.
Figure 39:
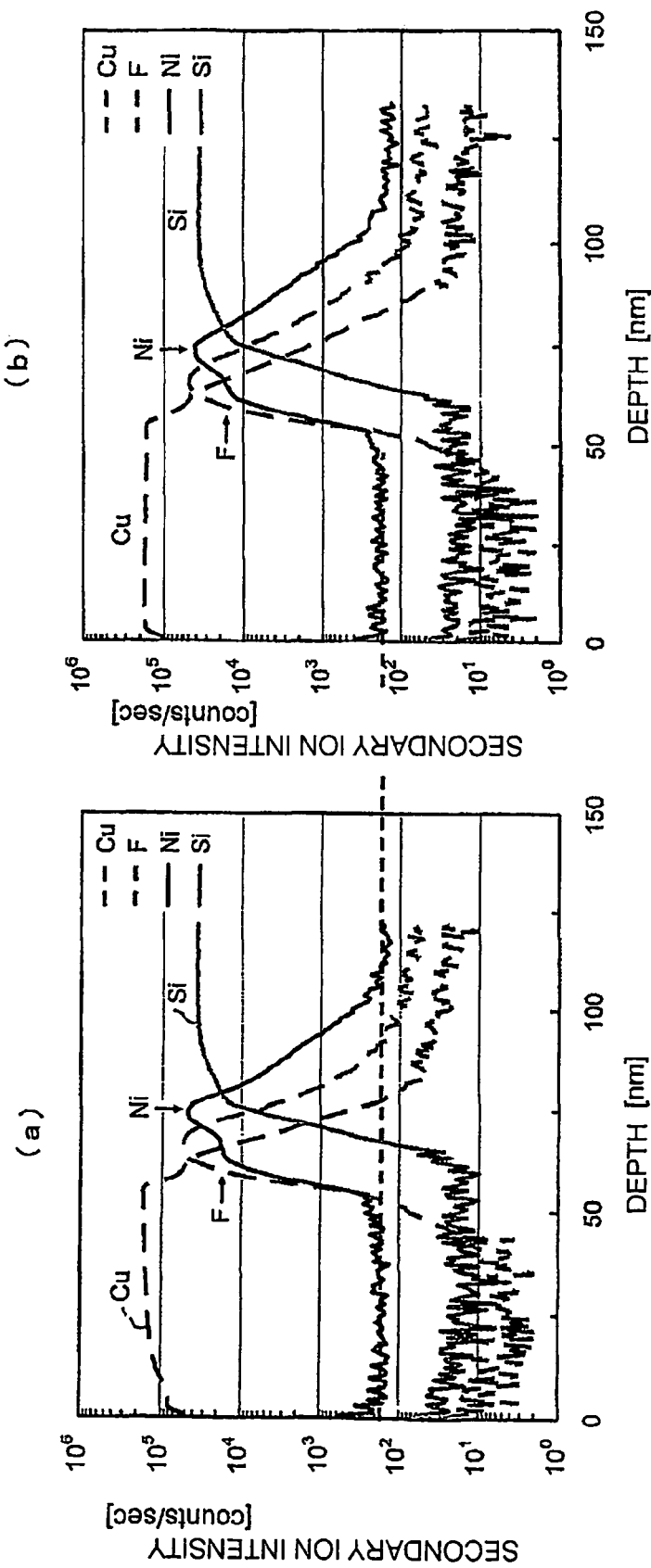
FIGS. 39 (a) and (b) are graphs showing the results of mutual diffusion evaluation of a sample having an NiF$_2$ film of 10 nm formed as a barrier layer, wherein (a) is a diagram showing the state before a mutual diffusion test (before annealing at 350° C.) and (b) is a diagram showing the state after the mutual diffusion test (after annealing at 350° C.).

FIG. 37 is a diagram showing the results of elemental analysis in the depth direction after the formation of the NiF₂ film. FIG. 38 represents sectional SEM photographs showing a metallographic structure in which a Cu layer is formed on an NiF₂ layer, wherein the right photograph enlarges a portion of the left photograph.

FIG. 39(a) and FIG. 39(b) are graphs showing the results of mutual diffusion evaluation of a sample having an NiF₂ film of 10 nm formed as a barrier layer, wherein (a) is a diagram showing the state before a mutual diffusion test (before annealing at 350° C.) and (b) is a diagram showing the state after the mutual diffusion test (after annealing at 350° C.). FIGS. 39(a) and (b) show that there is no diffusion of Cu or Ni even after the annealing and thus it completely functions as a barrier to Cu.

INDUSTRIAL APPLICABILITY

As described above, an interlayer insulating film comprising a CFx film according to this invention and its manufacturing method and an interconnection structure and its manufacturing method are optimum for a semiconductor device or a wiring board having a low-permittivity interlayer insulating film and an interconnection structure, or an electronic device including them.

The invention claimed is:

1. An interlayer insulating film comprising an insulating film formed on an underlayer, said interlayer insulating film comprises a first fluorocarbon film formed on said underlayer and a second fluorocarbon film having a permittivity lower than that of said first fluorocarbon film formed on said first fluorocarbon film,
   wherein said first fluorocarbon film is formed by CVD using a plasma generated by using a Xe or Kr gas, said second fluorocarbon film being formed by CVD using a plasma generated by using an Ar gas.

2. The interlayer insulating film according to claim 1, wherein said first fluorocarbon film has a thickness of 5 to 10 nm and said second fluorocarbon film has a thickness of 280 to 500 nm.

3. The interlayer insulating film according to claim 1, wherein the permittivity of said second fluorocarbon film is 1.5 to 2.5.

4. The interlayer insulating film according to claim 1, wherein said underlayer comprises at least one of an SiCN layer, an $Si_3N_4$ layer, an SiCO layer, and an $SiO_2$ layer formed on a base body.

5. The interlayer insulating film according to claim 1, wherein said first fluorocarbon film is provided for preventing generation of a fluorosilane gas produced by a reaction with said underlayer.

6. The interlayer insulating film according to claim 1, wherein each of said first and second fluorocarbon films is a low-permittivity film.

7. The interlayer insulating film according to claim 1, further comprising a film formed on said insulating film and made of at least one of $Si_3N_4$, SiCN, and SiCO.

8. The interlayer insulating film according to claim 1, wherein a surface of said second fluorocarbon film is nitrided.

9. The interlayer insulating film according to claim 8, wherein a thickness of a nitrided portion of said surface is 1 to 5 nm.

10. A method of forming a fluorocarbon film on an underlayer using a fluorocarbon gas and a rare gas, said method comprising a first step of forming a first fluorocarbon film on said underlayer by a plasma generated by using a Xe or Kr gas and a second step of fanning a second fluorocarbon film having a permittivity lower than that of said first fluorocarbon film on said first fluorocarbon film by a plasma generated by using an Ar gas.

11. The method according to claim 10, wherein said first fluorocarbon film is formed up to a thickness of 5 to 10 nm, said second fluorocarbon film being formed up to a thickness of 280 to 500 nm on said first fluorocarbon film.

12. The method according to claim 10, wherein said underlayer is a layer including at least one of an SiCN layer, an $Si_3N_4$ layer, an $SiO_2$ layer, and an SiCO layer formed on a base body.

13. The method according to claim 12, wherein said $Si_3N_4$ or SiCN, is formed by adding a nitrogen gas to said rare gas, and flowing a $SiH_4$ gas as a reactive gas, and said SiCO is formed by adding an oxidizing gas to said rare gas, and flowing a $SiH_4$ gas as a reactive gas.

14. The method according to claim 10, wherein a surface of said second fluorocarbon film is annealed, and nitrided after annealing.

15. A method of manufacturing an interconnection structure comprising a first step of forming a first fluorocarbon film on an underlayer using a fluorocarbon gas and a rare gas whose plasma has an electron temperature lower than that of Ar, a second step of forming a second fluorocarbon film on said first fluorocarbon film by a plasma generated by using an Ar gas, a step of forming a contact hole in said fluorocarbon films, a step of filling at least copper in said contact hole, and a step of forming at least a layer of a fluoride of nickel on a side surface of said contact hole as a barrier layer for preventing diffusion of said copper.

16. The method according to claim 15, wherein said first fluorocarbon film is formed in a thickness of 5 to 10 nm, said second fluorocarbon film being formed in a thickness of 280 to 500 nm.

17. The method according to claim 15, wherein a permittivity of said second fluorocarbon film is adjusted to 1.5 to 2.5.

18. The method according to claim 15, wherein said underlayer includes at least one of an SiCN layer, an $Si_3N_4$ layer, an SiCO layer, and an $SiO_2$ layer formed on a base body.

19. The method according to claim 15, wherein said rare gas used in said first step is a Xe gas.

20. The method according to claim 15, wherein said first and second fluorocarbon films are each a low-permittivity film.

21. The method according to claim 18, wherein said $Si_3N_4$ or SiCN is formed by adding at least one of a nitriding gas to said rare gas, and flowing an $SiH_4$ gas as a reactive gas, and said SiCO is formed by adding an oxidizing gas to said rare gas, and flowing a $SiH_4$ gas as a reactive gas.

22. The method according to claim 15, wherein a surface of said second fluorocarbon film is nitrided.

23. An electronic device having a multilayer interconnection structure, said electronic device comprising, as an interlayer insulating film of said multilayer interconnection structure, at least a first fluorocarbon film formed on an underlayer and a second fluorocarbon film formed on said first fluorocarbon film and having a permittivity lower than that of said first fluorocarbon film,
    wherein, said interlayer insulating film has a contact hole, a metal containing at least copper is filled in said contact hole, and a barrier layer of a fluoride of nickel is interposed between said first and second fluorocarbon films and said metal at a side surface of said contact hole.

24. The electronic device according to claim 23, wherein said first fluorocarbon film has a thickness of 5 to 10 nm, said second fluorocarbon film having a thickness of 280 to 500 nm.

25. The electronic device according to claim 23, wherein said underlayer includes at least one of an SiCN layer, an $Si_3N_4$ layer, an SiCO layer, and an $SiO_2$ layer.

26. The electronic device according to claim 23, further comprising at least one of an $Si_3N_4$ layer, an SiCN layer, and an SiCO layer formed on said second fluorocarbon film.

27. The electronic device according to claim 23, wherein said first fluorocarbon film is formed by CVD using a plasma generated by using a Xe or Kr gas, said second fluorocarbon film being formed by CVD using a plasma generated by using an Ar gas.

28. The electronic device according to claim 23, wherein a surface of said second fluorocarbon film is nitrided.

29. The electronic device according to claim 28, wherein a thickness of a nitrided portion of said surface is 1 to 5 nm.

30. A method of manufacturing an electronic device having a multilayer interconnection structure, the method including a step of forming a fluorocarbon film on an underlayer using a fluorocarbon gas and a rare gas, said method characterized in that said step comprises a first step of forming a first fluorocarbon film on said underlayer by a plasma generated by using a Xe or Kr gas and a second step of forming a second fluorocarbon film having a permittivity lower than that of said first fluorocarbon film on said first fluorocarbon film by a plasma generated by using an Ar gas.

31. The method according to claim 30, wherein said first fluorocarbon film is formed up to 5 to 10 nm, said second fluorocarbon film being formed up to 280 to 500 nm on said first fluorocarbon film.

32. The method according to claim 30, wherein said underlayer includes at least one of an SiCN layer, an $Si_3N_4$ layer, an $SiO_2$ layer, and an SiCO layer.

33. The method according to claim 30, further comprising a third step of nitriding a surface of said second fluorocarbon film.

34. The method according to claim 30, further comprising, after the step of forming said fluorocarbon film, a step of generating a plasma using a mixed gas of hydrogen and oxygen in a chamber, thereby cleaning an inner wall of said chamber.

35. The interlayer insulating film according to claim 9, wherein the thickness of a nitrided portion of said surface is 2 to 3 nm.

36. The electronic device according to claim 29, wherein the thickness of a nitrided portion of said surface is 2 to 3 nm.

* * * * *